(12) United States Patent
Han et al.

(10) Patent No.: US 8,917,558 B2
(45) Date of Patent: Dec. 23, 2014

(54) NONVOLATILE MEMORY DEVICES, OPERATING METHODS THEREOF AND MEMORY SYSTEMS INCLUDING THE SAME

(75) Inventors: Jinman Han, Seongnam-Si (KR); Donghyuk Chae, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 478 days.

(21) Appl. No.: 12/985,695

(22) Filed: Jan. 6, 2011

(65) Prior Publication Data

US 2011/0194357 A1 Aug. 11, 2011

Related U.S. Application Data

(60) Provisional application No. 61/356,712, filed on Jun. 21, 2010.

(30) Foreign Application Priority Data

Feb. 9, 2010 (KR) ........................ 10-2010-0011989

(51) Int. Cl.
*G11C 16/14* (2006.01)
*G11C 16/16* (2006.01)
(52) U.S. Cl.
CPC ..................................... *G11C 16/16* (2013.01)
USPC ................................ 365/185.29; 365/185.05
(58) Field of Classification Search
USPC ........................... 365/185.05, 185.23, 185.29
See application file for complete search history.

(56) References Cited

U.S. PATENT DOCUMENTS

| | | | |
|---|---|---|---|
| 5,511,022 A | 4/1996 | Yim et al. |
| 5,673,223 A | 9/1997 | Park |
| 5,715,193 A | 2/1998 | Norman |
| 5,740,107 A | 4/1998 | Lee |
| 5,923,587 A | 7/1999 | Choi |
| 6,009,014 A | 12/1999 | Hollmer et al. |
| 6,028,788 A | 2/2000 | Choi et al. |
| 6,285,587 B1 | 9/2001 | Kwon |
| 6,295,227 B1 | 9/2001 | Sakui et al. |
| 6,650,566 B2 | 11/2003 | Jeong et al. |
| 6,850,439 B1 | 2/2005 | Tanaka |

(Continued)

FOREIGN PATENT DOCUMENTS

| | | |
|---|---|---|
| CN | 1906700 A | 1/2007 |
| CN | 101165909 A | 4/2008 |

(Continued)

OTHER PUBLICATIONS

Jaehoon Jang et al. "Vertical Cell Array using TCAT (Terabit Cell Array Transistor) Technology for Ultra High Density NAND Flash Memory", VLSI Symp. Tech Dig., pp. 192-193, 2009.

(Continued)

*Primary Examiner* — Douglas King
(74) *Attorney, Agent, or Firm* — Harness, Dickey & Pierce, P.L.C.

(57) ABSTRACT

Nonvolatile memory device, operating methods thereof, and memory systems including the same. In the operating method, a ground select line of a first string connected to a bit line may be floated. An erase prohibition voltage may be applied to a ground select line of a second string connected to the bit line. An erase operation voltage may be applied to the first and second strings.

19 Claims, 30 Drawing Sheets

(56) References Cited

U.S. PATENT DOCUMENTS

| | | |
|---|---|---|
| 6,894,924 B2 | 5/2005 | Choi et al. |
| 6,975,542 B2 | 12/2005 | Roohparvar |
| 7,064,981 B2 | 6/2006 | Roohparvar |
| 7,064,986 B2 | 6/2006 | Lee et al. |
| 7,079,419 B2 | 7/2006 | Roohparvar |
| 7,149,124 B2 | 12/2006 | Nazarian |
| 7,177,192 B2 | 2/2007 | Yoon et al. |
| 7,233,522 B2 | 6/2007 | Chen et al. |
| 7,292,476 B2 | 11/2007 | Goda et al. |
| 7,403,422 B2 | 7/2008 | Kim et al. |
| 7,403,429 B2 | 7/2008 | Chae et al. |
| 7,408,806 B2 | 8/2008 | Park et al. |
| 7,417,904 B2 | 8/2008 | Sivero et al. |
| 7,450,433 B2 | 11/2008 | Wan et al. |
| 7,480,178 B2 | 1/2009 | Park et al. |
| 7,489,556 B2 | 2/2009 | Tanzawa |
| 7,518,920 B2 | 4/2009 | Kang |
| 7,529,138 B2 | 5/2009 | Park et al. |
| 7,532,514 B2 | 5/2009 | Cernea et al. |
| 7,551,477 B2 | 6/2009 | Mokhlesi et al. |
| 7,551,487 B2 | 6/2009 | Park et al. |
| 7,551,492 B2 | 6/2009 | Kim |
| 7,566,927 B2 | 7/2009 | Kim et al. |
| 7,606,074 B2 | 10/2009 | Wan et al. |
| 7,633,803 B2 | 12/2009 | Lee |
| 7,652,931 B2 | 1/2010 | Park et al. |
| 7,668,014 B2 | 2/2010 | Hwang |
| 7,724,577 B2 | 5/2010 | Goda et al. |
| 7,778,078 B2 | 8/2010 | Nagadomi et al. |
| 7,778,084 B2 | 8/2010 | Kim et al. |
| 7,813,184 B2 | 10/2010 | Kim et al. |
| 7,859,902 B2 | 12/2010 | Maejima |
| 7,888,731 B2 | 2/2011 | Kim |
| 7,924,629 B2 | 4/2011 | Park et al. |
| 7,933,151 B2 | 4/2011 | Maeda et al. |
| 7,936,004 B2 | 5/2011 | Kito et al. |
| 7,936,617 B2 | 5/2011 | Sudo |
| 7,940,572 B2 | 5/2011 | Kim |
| 7,952,136 B2 | 5/2011 | Kito et al. |
| 7,983,084 B2 | 7/2011 | Tokiwa et al. |
| 8,013,389 B2 | 9/2011 | Oh et al. |
| 8,023,321 B2 | 9/2011 | Kim |
| 8,125,825 B2 | 2/2012 | Seol |
| 8,149,635 B2 | 4/2012 | Lee |
| 8,169,826 B2 | 5/2012 | Hishida et al. |
| 8,189,391 B2 | 5/2012 | Itagaki et al. |
| 8,228,733 B2 | 7/2012 | Tokiwa et al. |
| 8,243,518 B2 | 8/2012 | Oh et al. |
| 8,274,108 B2 | 9/2012 | Katsumata et al. |
| 8,318,602 B2 | 11/2012 | Kito et al. |
| 8,467,246 B2 | 6/2013 | Kim et al. |
| 8,570,805 B2 | 10/2013 | Lee et al. |
| 8,582,372 B2 | 11/2013 | Kim |
| 8,638,608 B2 | 1/2014 | Lai et al. |
| 2002/0071311 A1 | 6/2002 | Jeong et al. |
| 2005/0006692 A1 | 1/2005 | Kim et al. |
| 2005/0128807 A1 | 6/2005 | Chen et al. |
| 2005/0141283 A1 | 6/2005 | Lee et al. |
| 2005/0248991 A1 | 11/2005 | Lee et al. |
| 2006/0050594 A1 | 3/2006 | Park |
| 2006/0140012 A1 | 6/2006 | Wan et al. |
| 2007/0018320 A1 | 1/2007 | Tanida et al. |
| 2007/0025220 A1 | 2/2007 | Yosikawa et al. |
| 2007/0070701 A1 | 3/2007 | Kim et al. |
| 2007/0158736 A1 | 7/2007 | Arai et al. |
| 2007/0159886 A1 | 7/2007 | Kang |
| 2007/0183204 A1 | 8/2007 | Kim et al. |
| 2007/0230253 A1 | 10/2007 | Kim |
| 2007/0247912 A1 | 10/2007 | Kamigaichi et al. |
| 2007/0252201 A1 | 11/2007 | Kito et al. |
| 2007/0297234 A1 | 12/2007 | Cernea et al. |
| 2008/0007999 A1 | 1/2008 | Park et al. |
| 2008/0099819 A1 | 5/2008 | Kito et al. |
| 2008/0173928 A1* | 7/2008 | Arai et al. ............ 257/316 |
| 2008/0173933 A1 | 7/2008 | Fukuzumi et al. |
| 2008/0181020 A1 | 7/2008 | Yu et al. |
| 2008/0253183 A1 | 10/2008 | Mizukami et al. |
| 2008/0279012 A1 | 11/2008 | Lee |
| 2008/0310230 A1 | 12/2008 | Kim et al. |
| 2009/0002182 A1 | 1/2009 | Knox et al. |
| 2009/0003075 A1 | 1/2009 | Kim et al. |
| 2009/0021983 A1 | 1/2009 | Wan et al. |
| 2009/0021988 A1 | 1/2009 | Hong et al. |
| 2009/0027935 A1 | 1/2009 | Nakata et al. |
| 2009/0097309 A1 | 4/2009 | Mizukami et al. |
| 2009/0122613 A1 | 5/2009 | Kim et al. |
| 2009/0168533 A1 | 7/2009 | Park et al. |
| 2009/0172267 A1 | 7/2009 | Oribe et al. |
| 2009/0175081 A1* | 7/2009 | Kim ................ 365/185.11 |
| 2009/0180323 A1 | 7/2009 | Park et al. |
| 2009/0268524 A1 | 10/2009 | Maejima |
| 2009/0288523 A1 | 10/2009 | Maejima |
| 2009/0279359 A1 | 11/2009 | Goda et al. |
| 2009/0316491 A1 | 12/2009 | Park et al. |
| 2010/0038703 A1 | 2/2010 | Fukuzumi et al. |
| 2010/0124120 A1 | 5/2010 | Park et al. |
| 2010/0159657 A1 | 6/2010 | Arai et al. |
| 2010/0177566 A1 | 7/2010 | Kim et al. |
| 2010/0195395 A1 | 8/2010 | Jeong et al. |
| 2010/0238732 A1 | 9/2010 | Hishida et al. |
| 2011/0063913 A1 | 3/2011 | Maejima |
| 2011/0170352 A1 | 7/2011 | Kim |
| 2011/0189853 A1 | 8/2011 | Kito et al. |
| 2011/0199825 A1 | 8/2011 | Han et al. |
| 2011/0216603 A1 | 9/2011 | Han et al. |
| 2011/0238913 A1 | 9/2011 | Kurashige et al. |
| 2012/0099377 A1 | 4/2012 | Maejima |
| 2012/0275234 A1 | 11/2012 | Lee et al. |
| 2013/0182502 A1 | 7/2013 | Cheo et al. |
| 2014/0022846 A1 | 1/2014 | Kim |

FOREIGN PATENT DOCUMENTS

| | | |
|---|---|---|
| JP | 08-279295 | 10/1996 |
| JP | 9007383 A | 1/1997 |
| JP | 10-032269 A | 2/1998 |
| JP | H10-093083 A | 4/1998 |
| JP | 2000-222895 A | 8/2000 |
| JP | 2002203393 A | 7/2002 |
| JP | 2005032430 A | 2/2005 |
| JP | 2005-116119 A | 4/2005 |
| JP | 2005196931 A | 7/2005 |
| JP | 2006-073168 A | 3/2006 |
| JP | 2007087569 A | 4/2007 |
| JP | 2007-180389 A | 7/2007 |
| JP | 2007-184090 A | 7/2007 |
| JP | 2007-200540 A | 8/2007 |
| JP | 2007-266143 A | 10/2007 |
| JP | 2007272952 | 10/2007 |
| JP | 2007-293986 A | 11/2007 |
| JP | 2007-323716 A | 12/2007 |
| JP | 2008-103429 A | 5/2008 |
| JP | 2008-172164 A | 7/2008 |
| JP | 2008-310949 A | 12/2008 |
| JP | 2008-311650 A | 12/2008 |
| JP | 2009-026369 | 2/2009 |
| JP | 2009-088446 | 4/2009 |
| JP | 2009124107 | 6/2009 |
| JP | 2009-266281 | 11/2009 |
| JP | 2009-266948 A | 11/2009 |
| JP | 2011-508937 A | 3/2011 |
| KR | 100157342 B1 | 7/1998 |
| KR | 100390145 | 6/2002 |
| KR | 100688494 A | 1/2005 |
| KR | 100541819 A | 7/2005 |
| KR | 1020060129806 A | 12/2006 |
| KR | 10-0672151 | 1/2007 |
| KR | 100706797 B1 | 4/2007 |
| KR | 100729359 B1 | 6/2007 |
| KR | 10-0784862 B1 | 7/2007 |
| KR | 2007-0078355 A | 7/2007 |
| KR | 10-2007-0096972 | 10/2007 |
| KR | 10-0884861 A | 10/2007 |
| KR | 100897415 A | 11/2007 |

(56) References Cited

FOREIGN PATENT DOCUMENTS

| KR | 10-2008-0005765 | 1/2008 |
| KR | 100890016 A | 11/2008 |
| KR | 2008-0110168 A | 12/2008 |
| KR | 2009-0002471 A | 1/2009 |
| KR | 10-2009-0034776 | 4/2009 |
| KR | 1020090048877 | 5/2009 |
| KR | 10-2009-0072406 | 7/2009 |
| KR | 1020090079037 | 7/2009 |
| WO | WO-2009/086618 A1 | 7/2009 |

OTHER PUBLICATIONS

US Office Action dated Jan. 15, 2013 for related U.S. Appl. No. 13/023,934.

US Office Action dated Jan. 15, 2013 for related U.S. Appl. No. 13/028,918.

US Office Action dated Apr. 5, 2013 for U.S. Appl. No. 13/029,518.

US Office Action dated Jul. 23, 2013 for related U.S. Appl. No. 13/211,743.

US Office Action dated Jul. 31, 2013 for related U.S. Appl. No. 13/545,588.

Notice of Allowance dated Oct. 11, 2013 in corresponding U.S. Appl. No. 13/967,455.

Office Action dated Nov. 5, 2013 in corresponding U.S. Appl. No. 14/043,256.

Office Action dated Nov. 1, 2013 in corresponding U.S. Appl. No. 13/545,588.

U.S. Office Action dated Feb. 28, 2014 from related U.S. Appl. No. 13/721,963.

Notice of Allowance dated Mar. 11, 2014 from related U.S. Appl. No. 13/545,588.

Office Action dated Mar. 21, 2014 in copending U.S. Appl. No. 13/607,038.

Notice of Allowance dated Feb. 7, 2014 for related U.S. Appl. No. 13/967,455.

US Office Action dated Feb. 14, 2014 for related U.S. Appl. No. 14/029,100.

US Office Action dated Dec. 24, 2013 for related U.S. Appl. No. 13/867,716.

Notice of Allowance for corresponding U.S. Appl. No. 13/607,038 dated Aug. 1, 2014.

Notice of Allowance for corresponding U.S. Appl. No. 14/029,100 dated Aug. 8, 2014.

T. Maeda et al. "Multi-stacked 1G cell/layer Pipe-shaped BICS Flash Memory"; 2009 Symposium on VLSI Circuits, p. 22-23; Jun. 2009.

\* cited by examiner

Fig. 9

|  | Selected Strings | Unselected Strings |
|---|---|---|
| SSL | Float | Vss → Vm2 |
| WL | Vss ||
| GSL | Float | Vss → Vm1 |
| CSL | Float ||
| Substrate | Vers ||

Fig. 21

|  | Selected Strings | Unselected Strings |
|---|---|---|
| SSL | Float | Vm6 |
| WL | Float → Vss | |
| GSL | Vss → Float | Vss → Vm5 |
| CSL | Float | |
| Substrate | Vpre → Vers | |

NONVOLATILE MEMORY DEVICES, OPERATING METHODS THEREOF AND MEMORY SYSTEMS INCLUDING THE SAME

CROSS-REFERENCE TO RELATED APPLICATIONS

This U.S. non-provisional patent application claims priority under 35 U.S.C. §119 to Korean Patent Application No. 10-2010-0011989, filed on Feb. 9, 2010, in the Korean Intellectual Property Office (KIPO), and claims the benefit under 35 U.S.C. §119 of U.S. Provisional Application No. 61/356,712 filed on Jun. 21, 2010, the entire contents of which are hereby incorporated by reference.

BACKGROUND

1. Field

Example embodiments of the inventive concepts relate to semiconductor memory devices, and more particularly, to nonvolatile memory devices, operating methods thereof, and memory systems including the same.

2. Description of the Related Art

Semiconductor memory devices are memory devices that are realized using semiconductor materials such as silicon (Si), germanium (Ge), gallium arsenide (GaAs) and indium phosphide (InP).

Semiconductor memory devices are generally classified into volatile and nonvolatile memory devices. Volatile memory devices are memory devices in which stored data is erased when the power source is shut off. Examples of volatile memory devices include Static Random Access Memory (SRAM), Dynamic Random Access Memory (DRAM), and Synchronous Dynamic Random Access Memory (SDRAM). In contrast, the nonvolatile memory devices are memory devices that retain stored data even when the power is shut off. Examples of the nonvolatile memory devices include Read Only Memory (ROM), Programmable Read Only Memory (PROM), Erasable Programmable Read Only Memory (EPROM), Electrically Erasable Programmable Read Only Memory (EEPROM), flash memory, phase-change random access memory (PRAM), Magnetoresistive Random Access Memory (MRAM), Resistive Random Access Memory (RRAM) and Ferroelectric Random Access Memory (FRAM). Flash memory devices are largely categorized into NOR and NAND types.

SUMMARY

Example embodiments of the inventive concepts relate to semiconductor memory devices, and more particularly, to nonvolatile memory devices with reduced erase units, operating methods thereof, and a memory systems including the same.

Example embodiments of the inventive concepts may provide operating methods that include floating a ground select line of a first string connected to a bit line, applying an erase prohibition voltage to a ground select line of a second string connected to the bit line and applying an erase operation voltage to the first and second strings.

According to some example embodiments, the first and second strings may include memory cells that are sequentially disposed in a vertical direction to a substrate, respectively. In other example embodiments, the erase prohibition voltage may be higher than a threshold voltage of a ground select transistor connected to the ground select line of the second string. In still other example embodiments, the applying of the erase operation voltage may include applying a ground voltage to word lines connected to the first and second strings and applying an erase voltage to a common source line connected to the first and second strings.

In even other example embodiments, the applying of the erase operation voltage may include floating word lines connected to the first and second strings, applying a pre-voltage to a common source line connected to the first and second strings, applying an erase voltage to the common source line and applying a ground voltage to the word line. In yet other example embodiments, the method may further include applying a second erase prohibition voltage to a second ground select line of the second string. In further example embodiments, the second erase prohibition voltage may be lower than the erase prohibition voltage.

In still further example embodiments, the second erase prohibition voltage may be higher than a threshold voltage of a second ground select transistor connected to the second ground select line of the second string. In even further example embodiments, the method may further include applying a third erase prohibition voltage to a string select line of the second string.

In other example embodiments of the inventive concepts, nonvolatile memory devices may include a memory cell array including first and second strings connected between a bit line and a common source line, a driver configured to deliver a voltage to word lines connected to the first and second strings, select lines, and the common source line, and a read & write circuit configured to write/read data in/from in memory cells of the first and second strings, in which, during an erase operation, the driver is configured to apply the same voltage to a first word line of the first string and a second word line of the second string, and apply different voltages to a ground select line of the first string and a ground select line of the second string.

In some example embodiments, during an erase operation, the driver may be configured to float the ground select line of the first string, deliver an erase prohibition voltage to the ground select line of the second string, and apply erase operation voltages to the first and second word lines and the common source line. In other example embodiments, during an erase operation, the driver may be configured to apply a ground voltage to the first and second word lines, and apply an erase voltage to the common source line. In still other example embodiments, during an erase operation, the driver may be configured to control the voltage of the first and second word line from a floating state to a ground voltage, and control the voltage of the common source line from a pre-voltage to an erase voltage.

In even other example embodiments, during an erase operation, the driver may be configured to apply a second erase prohibition voltage to a second ground select line connected to the second string. In yet other example embodiments, the ground select line of the second string may be disposed between the second ground select line and the common source line, and the second erase prohibition voltage may have a level lower than the erase prohibition voltage. In further example embodiments, the first and second strings may include memory cells provided in a vertical direction to a substrate, respectively. In still further example embodiments, the first and second word lines may be electrically connected.

In still other example embodiments of the inventive concepts, a memory system may include a nonvolatile memory device; and a controller configured to control the nonvolatile memory device, and the nonvolatile memory device includes a memory cell array including first and second strings connected between a bit line and a common source line, a driver configured to deliver a voltage to word lines connected to the first and second strings, select lines, and the common source line, and a read & write circuit configured to write/read data in/from in memory cells of the first and second strings, and, during an erase operation, the driver is configured to apply the same voltage to a first word line of the first string and a second word line of the second string, and apply different voltages to a ground select line of the first string and a ground select line of the second string.

In some example embodiments, the nonvolatile memory device and the controller may constitute a semiconductor drive (Solid State Drive). In other example embodiments, the nonvolatile memory device and the controller may constitute a memory card.

According to example embodiments, a nonvolatile memory may include a memory cell array including first and second strings of memory cells connected between a bit line and a common source line, the strings each connected to at least one word line, at least one select line, and at least one ground select line, a driver configured to apply voltages to the word lines, select lines, ground select lines and the common source line, the driver configured to, during an erase operation, apply a same voltage to a first word line of the first string and a second word line of the second string, and to apply different voltages to a first ground select line of the first string and a second ground select line of the second string and a read & write circuit configured to write data to and read data from the memory cells of the first and second strings.

According to example embodiments, a memory system may include a nonvolatile memory device including a memory cell array with first and second strings of memory cells connected between a bit line and a common source line, the strings each connected to at least one word line, at least one select line, and at least one ground select line, a driver configured to apply voltages to the word lines, select lines, ground select lines and the common source line, the driver configured to, during an erase operation, apply a same voltage to a first word line of the first string and a second word line of the second string, and to apply different voltages to a first ground select line of the first string and a second ground select line of the second string, and a read & write circuit configured to write data to and read data from the memory cells of the first and second strings and a controller configured to control the nonvolatile memory device.

BRIEF DESCRIPTION OF THE DRAWINGS

Example embodiments will be more clearly understood from the following brief description taken in conjunction with the accompanying drawings. FIGS. 1-30 represent non-limiting, example embodiments as described herein.

FIG. 1 is a block diagram illustrating nonvolatile memory devices according to example embodiments of the inventive concepts;

FIG. 2 is a block diagram illustrating a memory cell array of FIG. 1;

FIG. 3 is a perspective view illustrating one of the memory blocks of FIG. 2 according to example embodiments of the inventive concepts;

FIG. 4 is a cross-sectional view taken along the line IV-IV' of the memory block of FIG. 3;

FIG. 5 is a cross-sectional diagram illustrating the structure of a transistor of FIG. 4;

FIG. 6 is a circuit diagram illustrating an equivalent circuit of the memory block described with reference to FIGS. 3-5;

FIG. 7 is a cross-sectional diagram illustrating one NAND string of the memory block described with reference to FIGS. 3-6;

FIG. 8 is a circuit diagram illustrating an erase unit of the memory block of FIG. 6;

FIG. 9 is a table illustrating erase operation voltage conditions of the erase unit of FIG. 8;

FIG. 10 is a timing diagram illustrating voltage variation of selected strings according to the voltage conditions of FIG. 9;

FIG. 11 is a cross-sectional diagram illustrating the state of a selected string according to the voltage variation of FIG. 10;

FIG. 12 is a timing diagram illustrating voltage variation of unselected strings according to the voltage conditions of FIG. 9;

FIG. 13 is a cross-sectional diagram illustrating the state of an unselected string according to the voltage variation of FIG. 12;

FIG. 14 is a circuit diagram illustrating a memory block of FIG. 2 according to example embodiments of the inventive concepts;

FIG. 15 is a timing diagram illustrating voltage variation of unselected strings of FIG. 14 during an erase operation;

FIG. 16 is a circuit diagram illustrating a memory block of FIG. 2 according to example embodiments of the inventive concepts;

FIG. 17 is a circuit diagram illustrating a memory block of FIG. 2 according to example embodiments of the inventive concepts;

FIG. 18 is a perspective view illustrating a memory block of FIG. 3 according to example embodiments of the inventive concepts;

FIG. 19 is a perspective view illustrating one of the memory blocks of FIG. 2 according to example embodiments;

FIG. 20 is a cross-sectional view taken along the line XX-XX' of the memory block of FIG. 19;

FIG. 21 is a table illustrating erase operation voltage conditions of the memory blocks of FIGS. 19 and 20;

FIG. 22 is a timing diagram illustrating voltage variation of selected strings according to the voltage conditions of FIG. 21;

FIG. 23 is a cross-sectional diagram illustrating the state of a selected string according to the voltage variation of FIG. 22;

FIG. 24 is a timing diagram illustrating voltage variation of unselected strings according to the voltage conditions of FIG. 22;

FIG. 25 is a cross-sectional diagram illustrating the state of an unselected string according to the voltage variation of FIG. 24;

FIG. 26 is a perspective view illustrating one of the memory blocks of FIG. 2 according to example embodiments;

FIG. 27 is a cross-sectional view taken along the line XXVII-XXVII' of the memory block of FIG. 26;

FIG. 28 is a block diagram illustrating memory systems including the nonvolatile memory device of FIG. 1;

FIG. 29 is a block diagram illustrating example applications of the memory systems of FIG. 28; and FIG. 30 is a diagram illustrating computing systems including the memory systems described with reference to FIG. 29.

Figure 1:
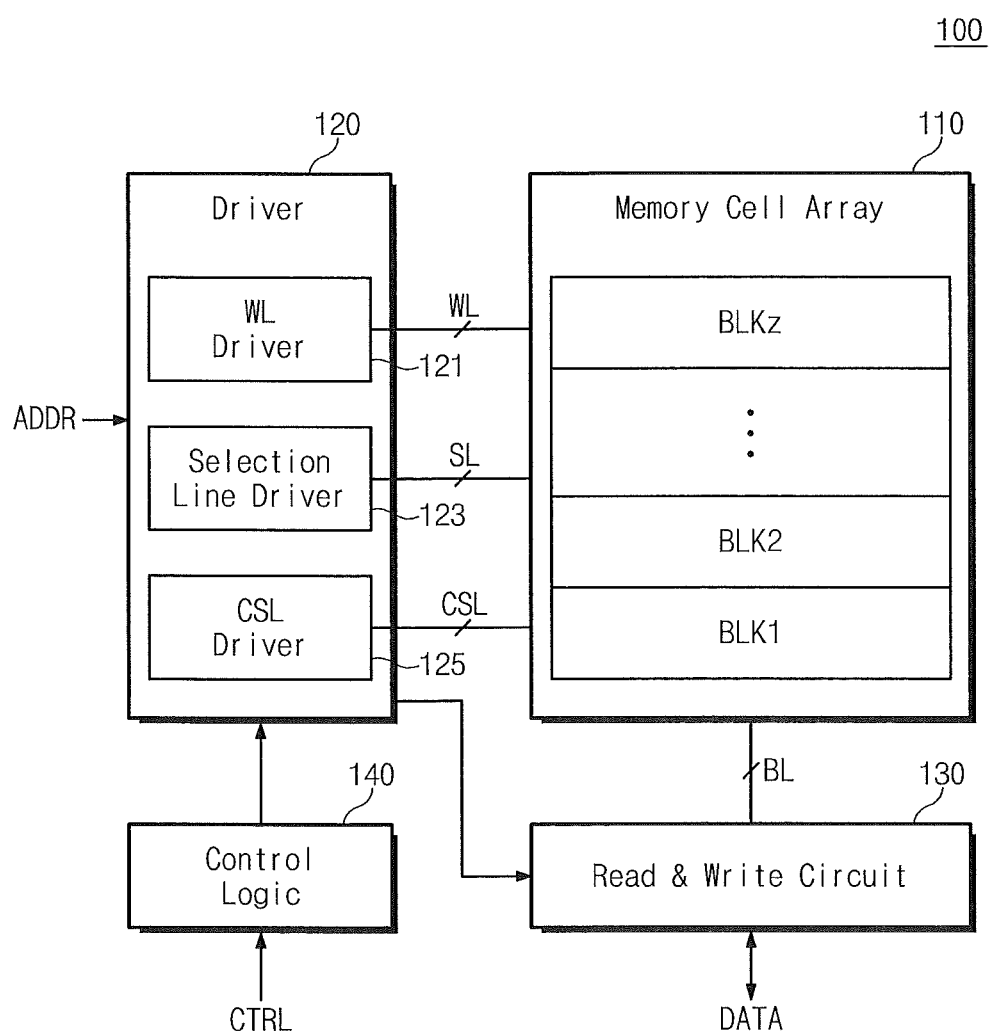

It should be noted that these figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a nonvolatile memory device 100 according to example embodiments of the inventive concepts. Referring to FIG. 1, the nonvolatile memory device 100 may include a memory cell array 110, a driver 120, a read & write circuit 130, and control logic 140. The memory cell array 110 may be connected to the driver 120 through word lines WL, and may be connected to the read & write circuit 30 through bit lines BL. The memory cell array 110 may include a plurality of memory cells. For example, memory cells arrayed in a row direction may be connected to the word lines WL, and memory cells arrayed in a column direction may be connected to the bit lines BL. For example, the memory cell array 110 may be configured to store one or more bits per cell.

The memory cell array 110 may include a plurality of memory blocks BLK1 to BLKz. Each memory block BLK may include a plurality of memory cells. A plurality of word lines WL, a plurality of select lines SL, and at least one common source line CSL may be provided to each memory block BLK. The driver 120 may be connected to the memory cell array 110 through the word lines WL. The driver 120 may be configured to operate in response to the control of the control logic 140. The driver 120 may receive an address ADDR from the outside.

The driver 120 may be configured to decode the received address ADDR. The driver 120 may select word lines WL using the decoded address. The driver 120 may be configured to apply a voltage to selected and unselected word lines WL. For example, the driver 120 may be configured to apply a program operation voltage associated with a program operation, a read operation voltage associated with a read operation, and/or an erase operation voltage associated with an erase operation to the word lines upon program operation, read operation, or erase operation, respectively. For example, the driver 120 may include a word line driver 121 that selects and drives word lines.

For example, the driver 120 may be configured to select and drive select lines SL. For example, the driver 120 may be configured to further select and drive a string select line SSL and a ground select line GSL. For example, the driver 120 may include a selection line driver 123 configured to select and drive select lines SL. For example, the driver 120 may be configured to drive a common source line CSL. For example, the driver 120 may include a common source line driver 125 configured to drive a common source line CSL. The read & write circuit 130 may be connected to the memory cell array 110 through the bit lines BL. The read & write circuit 130 may operate in response to the control of the control logic 140. The read & write circuit 130 may be configured to select bit lines BL.

For example, the read & write circuit 130 may receive data DATA from the outside, and write the received data in the memory cell array 110. The read & write circuit 130 may read data DATA from the memory cell array 110, and deliver the read data to the outside. The read & write circuit 130 may read data from a first storage region of the memory cell array 110, and write the read data in a second storage region of the memory cell array 110. For example, the read & write circuit 130 may be configured to perform a copy-back operation. For example, the read & write circuit 130 may include well-known components such as a page buffer (or page register), a column select circuit, and/or a data buffer (not shown). As another example, the read & write circuit 130 may include well-known components a sense amplifier, a write driver, a column select circuit, and/or a data buffer (not shown).

The control logic 140 may be connected to the driver 120 and the read & write circuit 130. The control logic 140 may be configured to control overall operations of the nonvolatile memory device 100. The control logic 140 may operate in response to control signals CTRL from the outside.

Figure 2:
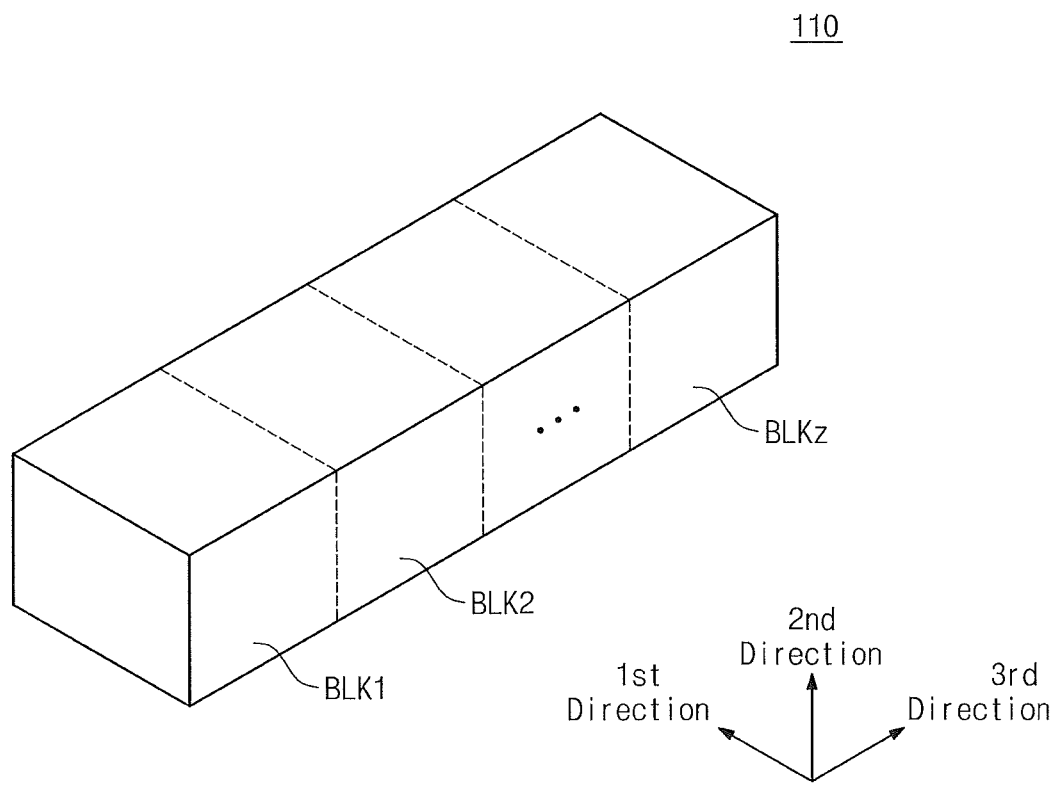

FIG. 2 is a block diagram illustrating a memory cell array 110 of FIG. 1. Referring to FIG. 2, the memory cell array 110 may include a plurality of memory blocks BLK1-BLKz. Each memory block BLK may have a three-dimensional structure (or vertical structure). For example, each memory block BLK may include structures extending in first to third directions. Each memory block BLK may include a plurality of NAND strings (not shown) extending in the second direction. A plurality of NAND strings may be provided in the first and third directions.

Each NAND string may be connected to bit lines BL, string select lines SSL, ground select lines GSL, word lines WL, and common source lines CSL. Each memory block may be connected to a plurality of bit lines BL, a plurality of string select lines SSL, a plurality of ground select lines GSL, a plurality of word lines WL, and a plurality of common source lines CSL. The memory blocks BLK1-BLKz will be described in detail with reference to FIG. 3.

Figure 3:
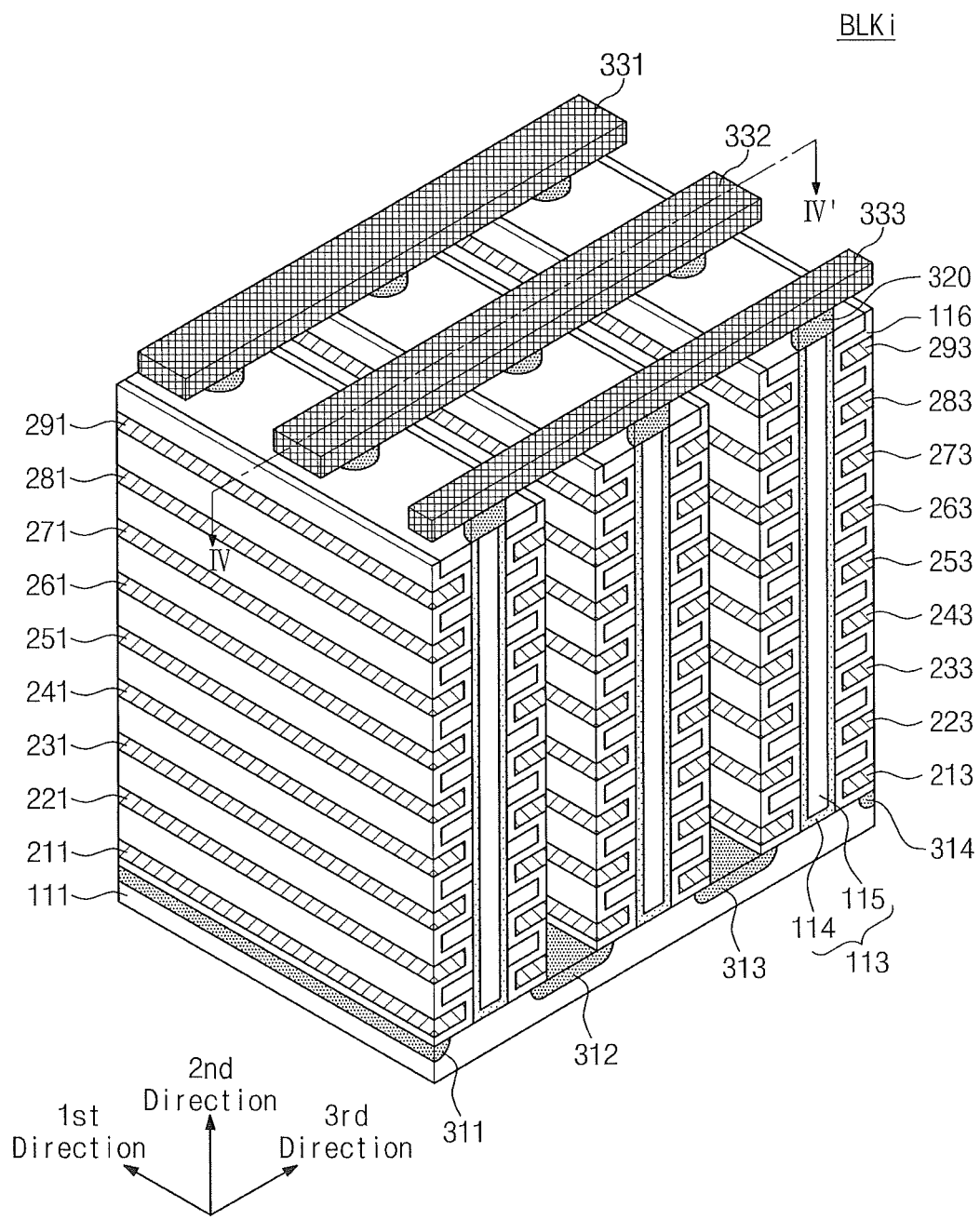
Figure 4:
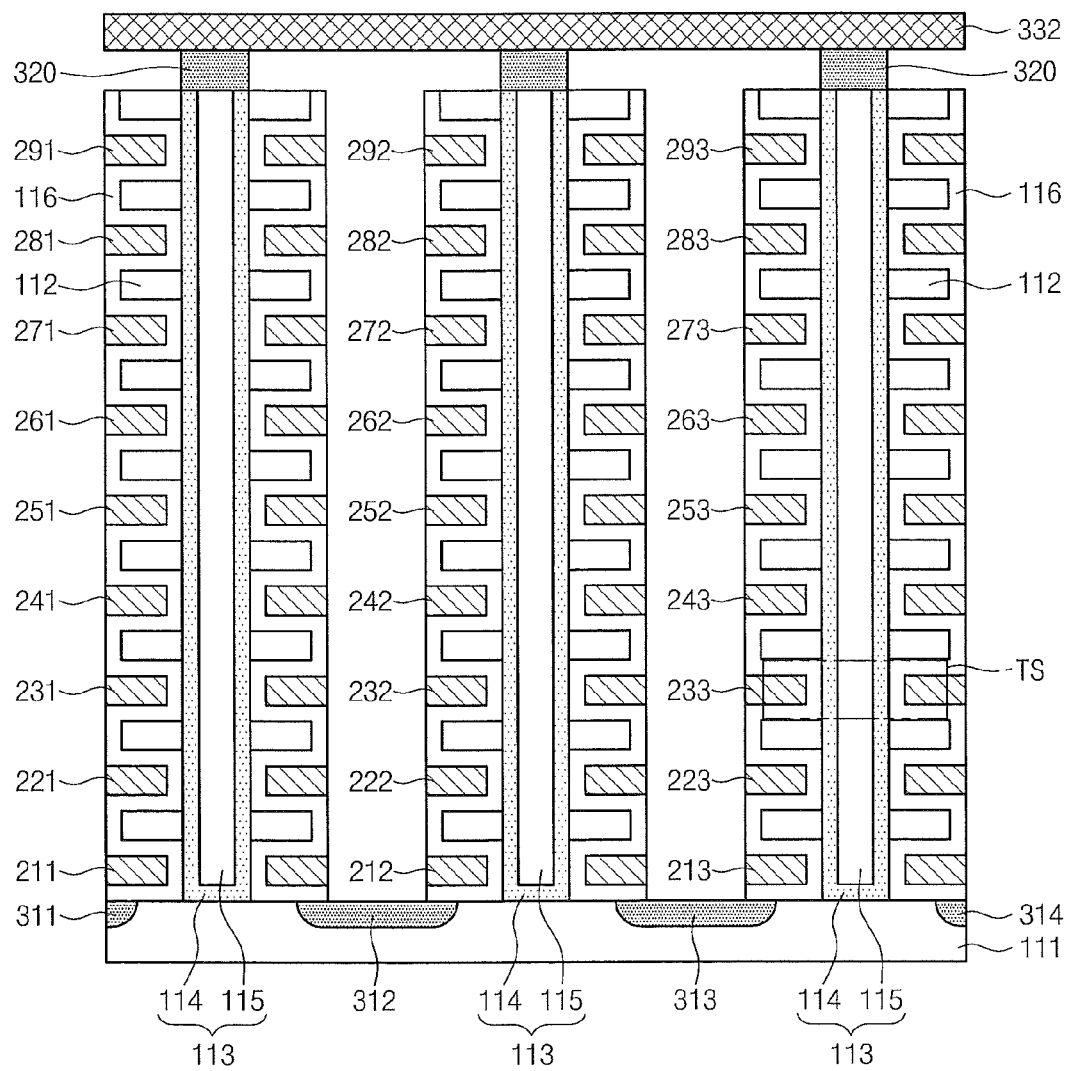

FIG. 3 is a perspective view illustrating one memory block BLKi among memory blocks BLK1-BLKz of FIG. 2 according to example embodiments of the inventive concepts. FIG. 4 is a cross-sectional view taken along the line IV-IV' of the memory block BLKi of FIG. 3. Referring to FIGS. 3 and 4, the memory block BLKi may include structures extending in first and third directions. A substrate 111 may be provided. For example, the substrate 111 may include silicon material doped with first type impurities (e.g., p-type impurities). The substrate 111 may be, for example, a p-type well (e.g., pocket p-well). Hereinafter, the substrate 111 will be described as including p-type silicon, but example embodiments are not limited thereto.

A plurality of doping regions 311-314 extending in the first direction may be on the substrate 111. For example, the plurality of doping regions 311-314 may be a second type different from the substrate 111. For example, the plurality of doping regions 311-314 may be n-type. Hereinafter, the first through fourth doping regions 311-314 are described as being n-type, but example embodiments are not limited thereto. A plurality of insulating materials 112 extending in the first direction may be over the substrate 111 between the first and second doping regions 311 and 312 along the second direction (e.g., sequentially provided). For example, the plurality of insulating materials 112 and the substrate 111 may be along the second direction at intervals. For example, the plurality of insulating materials 112 may be along the second direction at intervals. The insulating materials 112 may include silicon oxide.

A plurality of pillars 113 may be over the substrate 111 (e.g., sequentially) between the first and second doping regions 311 and 312, and penetrate the insulating materials 112 along the second direction. For example, the plurality of pillars 113 may be connected to the substrate 111 through the insulating materials 112. Each of pillars 113 may be formed of a plurality of materials. For example, surface layers 114 of the pillars 113 may include silicon material doped with, for example, the first type. For example, the surface layer 114 may include silicon material doped with the same type as the substrate 111. Hereinafter, the surface layer 114 of the pillar 113 will be described as including p-type silicon, but embodiments are not limited thereto.

Internal layers 115 of the pillars 113 may be formed of insulating materials. For example, the internal layers 115 may include silicon oxide. An insulation layer 116 may be along the insulating materials 112, the pillars 113, and an exposed surface of the substrate 111 between the first and second doping regions 311 and 312. For example, the thickness of the insulation layer 116 may be smaller than a half of a distance between the insulating materials 112. A region that may receive a material except for the insulating materials 112 and the insulation layer 116 may be between a portion of the insulation layer 116 on the undersurface of a first insulating material of the insulating materials 112 and a portion of the insulation layer 116 on the upper surface of a second insulating material under the first insulating material.

Conductive materials 211-291 may be on an exposed surface of the insulation layer 116 between the first and second doping regions 311 and 312. For example, the conductive material 211 may extend in the first direction between the substrate 111 and the insulating material 112 adjacent to the substrate 111. The conductive material 211 may extend in the first direction between the substrate 111 and the insulation layer 116 on the undersurface of the insulating material 112 adjacent to the substrate 111.

Conductive material may be extended in the first direction between the insulation layer 116 on the upper surface of an insulating material and the insulation layer 116 on the undersurface of an insulating material disposed over the insulating material. For example, a plurality of conductive materials 221-281 may extend in the first direction between the insulating materials 112. The conductive material 291 may be extended in the first direction over the insulating materials 112. For example, the conductive materials 211-291 extending in the first direction may include metallic materials. For example, the conductive materials 211-291 extending in the first direction may include conductive materials (e.g., polysilicon).

Structures similar to the structures over the first and second doping regions 311 and 312 may be between the second and third doping regions 312 and 313. For example, a plurality of insulating materials 112 extending in the first direction, a plurality of pillars 113 in the first direction (e.g., sequentially disposed in the first direction) and penetrating the plurality of insulating materials 112 in the second direction, an insulation layer 116 on exposed surfaces of the plurality of pillars 113 and the plurality of insulating materials 112, and a plurality of conductive materials 212-292 may be between the second and third doping regions 312 and 313.

Structures similar to the structures over the first and second doping regions 311 and 312 may be between the third and fourth doping regions 313 and 314. For example, a plurality of insulating materials 112 extending in the first direction, a plurality of pillars 113 in the first direction (e.g., sequentially disposed in the first direction) and penetrating the plurality of insulating materials 112 in the second direction, an insulation layer 116 on exposed surfaces of the plurality of pillars 113 and the plurality of insulating materials 112, and a plurality of conductive materials 213-293 may be between the second and third doping regions 313 and 314.

Drains 320 may be over the plurality of pillars 113. For example, the drains 320 may include silicon materials doped with a second type. The drains 320 may include silicon materials doped with, for example, an n-type impurity. Hereinafter, the drains 320 will be described as including n-type silicon, but embodiments are not limited thereto. The width of each drain 320 may be, for example, greater than that of a corresponding pillar 113. For example, the drains 320 may be pad type structures on the upper surface of the pillars 113.

Conductive materials 331-333 extending in the third direction may be on the drains 320. The conductive materials 331-333 may be in the first direction (e.g., sequentially in the first direction). The respective conductive materials 331-333 may be connected to corresponding drains 320. For example, the drains 320 and the conductive materials 333 extending in the third direction may be connected to each other through contact plugs. The conductive materials 331-333 extending in the third direction may include metallic materials. The conductive materials 331-333 extending in the third direction may include conductive materials (e.g., polysilicon).

In FIGS. 3 and 4, the pillars 113 may form strings along with adjacent regions of the insulation layer 116 and adjacent regions of the plurality of conductive lines 211-291, 212-292, and 213-293 extending in the first direction. For example, the pillars 113 may form NAND strings along with the adjacent regions of the insulation layer 116 and the adjacent regions of the plurality of conductive lines 211-291, 212-292, and 213-293. The NAND strings may include a plurality of transistors TS.

Figure 5:
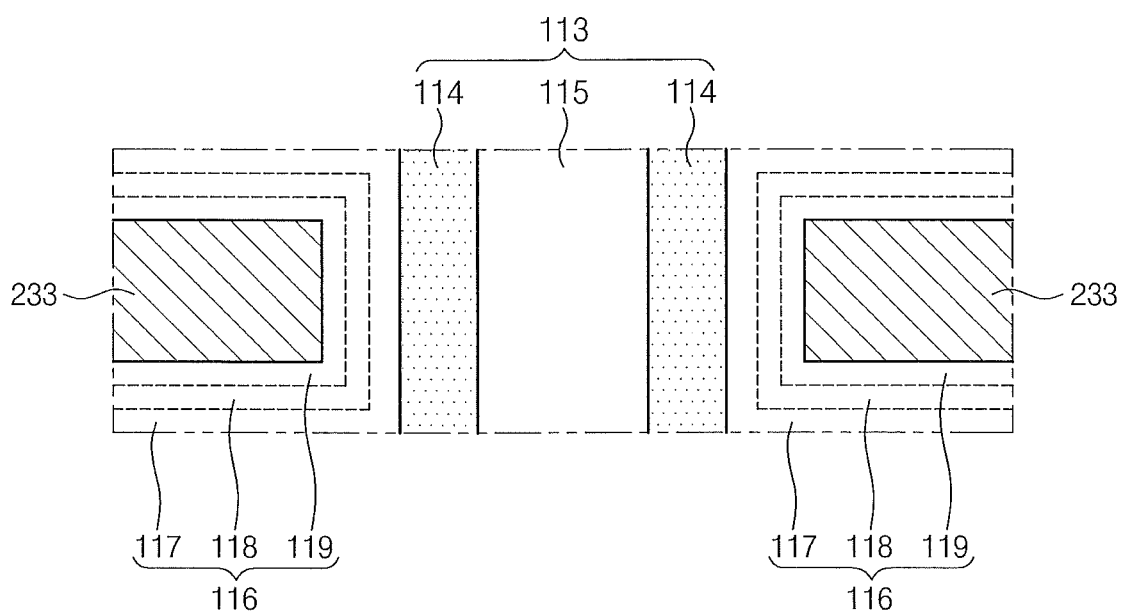

FIG. 5 is a cross-sectional diagram illustrating the structure of the transistor TS of FIG. 4. Referring to FIGS. 1-5, an insulation layer 116 may include at least three sub-insulation layers 117, 118 and 119. For example, conductive material 233 extending in the first direction may be adjacent to the sub-insulation layer 119 which may be, for example, a silicon oxide layer. The sub-insulation layer 117 adjacent to the pillar 113 may be, for example, a silicon oxide layer. The sub-insulation layer 118 between the silicon oxide layers 117 and 119 may be, for example, a silicon nitride layer. The insulation layer 116 may include Oxide-Nitride-Oxide (ONO).

The conductive material 233 may serve as a gate (e.g., control gate). The silicon oxide layer 119 may be a blocking insulation layer. The silicon nitride layer 118 may be a charge storage layer. For example, the silicon nitride layer 118 may serve as a charge trapping layer. The silicon oxide layer 117 adjacent to the pillar 113 may be a tunneling insulation layer. A p-type silicon layer 114 of the pillar 113 may serve as a body. The gate (e.g., control gate) 233, the blocking insulation layer 119, the charge storage layer 118, the tunneling insulation layer 117, and the body 114 may form a transistor (e.g., memory cell transistor structure). Hereinafter, the p-type silicon 114 of the pillar 113 will be referred to as a second-direction body.

The memory block BLKi may include a plurality of pillars 113. The memory block BLKi may include a plurality of NAND strings. The memory block BLKi may include a plurality of NAND strings extending in the second direction (e.g., direction vertical to the substrate). Each NAND string may include a plurality of transistor structures TS along the second direction. At least one of the plurality of transistor structures TS of each NAND string NS may serve as a string select transistor SST. At least one of the plurality of transistor structures TS of each NAND string may serve as a ground select transistor GST.

The gates (e.g., control gates) may correspond to the conductive materials 211-291, 212-292 and 213-293 extending in the first direction. The gates (e.g., control gates) may form word lines extending in the first direction and at least two select lines (e.g., at least one string select line SSL and at least one ground select line GSL). Conductive materials 331-333 extending in the third direction may be connected to one end of the NAND strings. For example, the conductive materials 331-333 extending in the third direction may serve as bit lines BL. A plurality of NAND strings may be connected to one bit line BL in one memory block BLKi.

Second type doping regions 311-314 extending in the first direction may be provided to the ends of the NAND strings opposite the bit line conductive materials 331-333. The second type doping region 311-314 extending in the first direction may serve as common source lines CSL. The memory block BLKi may include a plurality of NAND strings extending in a normal direction (second direction) to the substrate 111, and may be a NAND flash memory block (e.g., charge trapping type) in which a plurality of NAND strings are connected to one bit line BL.

Although it has been described in FIGS. 3-5 that the conductive materials 211-291, 212-292 and 213-293 extending in the first direction are nine layers, embodiments are not limited thereto. For example, the conductive materials 211-291, 212-292, and 213-293 extending in the first direction may be eight or sixteen layers, or more layers. Eight, sixteen or more transistors may be provided in one NAND string. Although it has been described in FIGS. 1-5 that three NAND strings are connected to one bit line BL embodiments are not limited thereto. For example, "m" NAND strings may be connected to one bit line BL in a memory block BLKi. The number of the conductive materials 211-291, 212-292, and 213-293 extending in the first direction and the number of the common source lines 311-314 may be determined by the number of the NAND strings connected to one bit line BL.

Although it has been described in FIGS. 3-5 that three NAND strings are connected to one conductive material extending in the first direction embodiments are not limited thereto. For example, "n" NAND strings may be connected to one conductive material extending in the first direction. In this case, the number of the bit lines 331-333 may be determined by the number of the NAND strings connected to one conductive material extending in the first direction.

Figure 6:
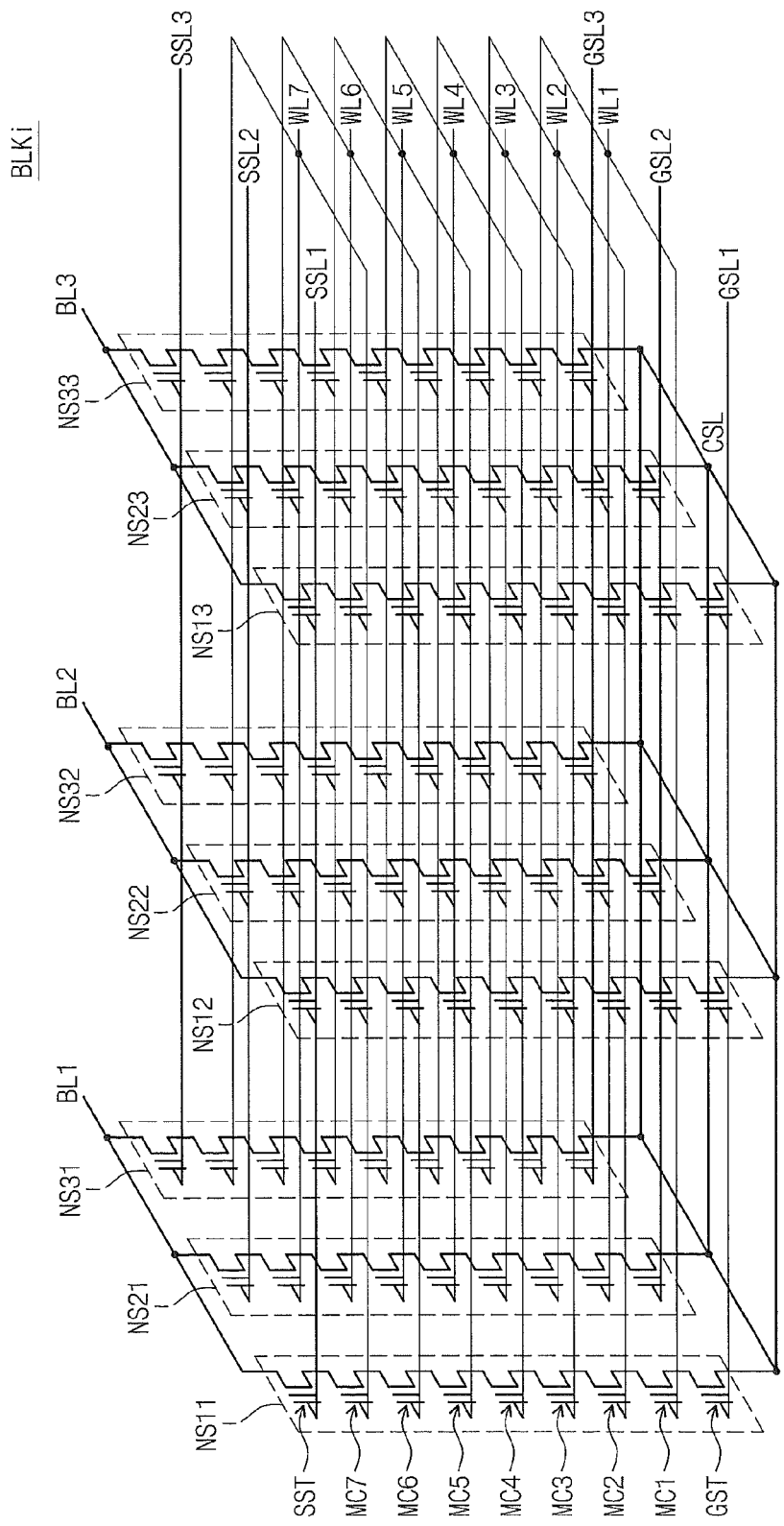

FIG. 6 is a circuit diagram illustrating an equivalent circuit of the memory block BLKi described with reference to FIGS. 3-5. Referring to FIGS. 3-6, NAND strings NS11-NS31 may be between a first bit line BL1 and a common source line CSL. The first bit line BL1 may correspond to the conductive material 331 extending in the third direction. NAND strings NS12-NS32 may be between a second bit line BL2 and the common source line CSL. The second bit line BL2 may correspond to the conductive material 332 extending in the third direction. NAND strings NS13-NS33 may be between a third bit line BL3 and the common source line CSL. The third bit line BL3 may correspond to the conductive material 333 extending in the third direction.

A string select transistor SST of each NAND string NS may be connected to a corresponding bit line BL. A ground select transistor GST of each NAND string NS may be connected to the common source line CSL. Memory cells MC (e.g., MC1-MC7) may be between the string select transistor SST and the ground select transistor GST of each NAND string NS.

Hereinafter, the NAND strings NS are described by units of rows and columns. NAND strings NS11-NS31 connected in common to one bit line BL may form one column. For example, the NAND strings NS11-NS31 connected to the first bit line BL1 may be a first column. The NAND strings NS12-NS32 connected to the second bit line BL2 may be a second column. The NAND strings NS13-NS33 connected to the third bit line BL3 may be a third column. NAND strings NS connected to one string select line SSL may form one row. For example, the NAND strings NS11-NS13 connected to the first string select line SSL1 may be a first row. The NAND strings NS21-NS23 connected to the second string select line SSL2 may be a second row. The NAND strings NS31-NS33 connected to the third string select line SSL3 may be a third row.

A height may be defined in each NAND string NS. For example, in each NAND string NS, a height of a memory cell MC1 adjacent to the ground select transistor GST may be 1. In each NAND string NS, as the memory cell becomes closer to the string select transistor SST, the height of a memory cell may increase. In each NAND string NS, the height of a memory cell MC7 adjacent to the string select transistor SST may be 7. Although example embodiments are described with respect to height, such description is for clarity of explanation only, and example embodiments are not limited to a particular orientation.

NAND strings NS in the same row may share a string select line SSL. NAND strings NS in different rows may be connected to different string select lines SSL. Memory cells of NAND strings NS in the same row, which are of the same height, may share a word line. At the same height, word lines WL of NAND strings NS in different rows may be connected in common. For example, word lines WL may be connected in common at a layer in which the conductive materials 211-291, 212-292, and 213-293 extend in the first direction. For example, the conductive materials 211-291, 212-292, and 213-293 extending in the first direction may be connected to an upper layer through a contact. The conductive materials 211-291, 212-292 and 213-293 extending in the first direction may be connected in common at the upper layer.

NAND strings NS in the same row may share a ground select line GSL. NAND strings NS in different rows may be connected to different ground select lines GSL. The common source line CSL may be connected in common to the NAND strings NS. For example, the first to fourth doping regions 311-314 may be connected in an active region on the substrate 111. For example, the first and fourth doping regions 311-314 may be connected to an upper layer through a contact. The first to fourth doping regions 311-314 may be connected in common at the upper layer.

As shown in FIG. 6, word lines WL of the same height may be connected in common. When a specific word line WL is selected, all NAND strings NS connected to the specific word line WL may be selected. NAND strings NS in different rows may be connected to different string select lines SSL. By selecting string select lines SSL1-SSL3, NAND strings NS of an unselected row among NAND strings NS connected to the same word line WL may be separated from the bit lines BL1-BL3. A row of NAND strings NS may be selected by selecting one of the string select lines SSL1-SSL3. NAND strings NS of a selected row may be selected by columnar unit by selecting the bit lines BL1-BL3.

Figure 7:
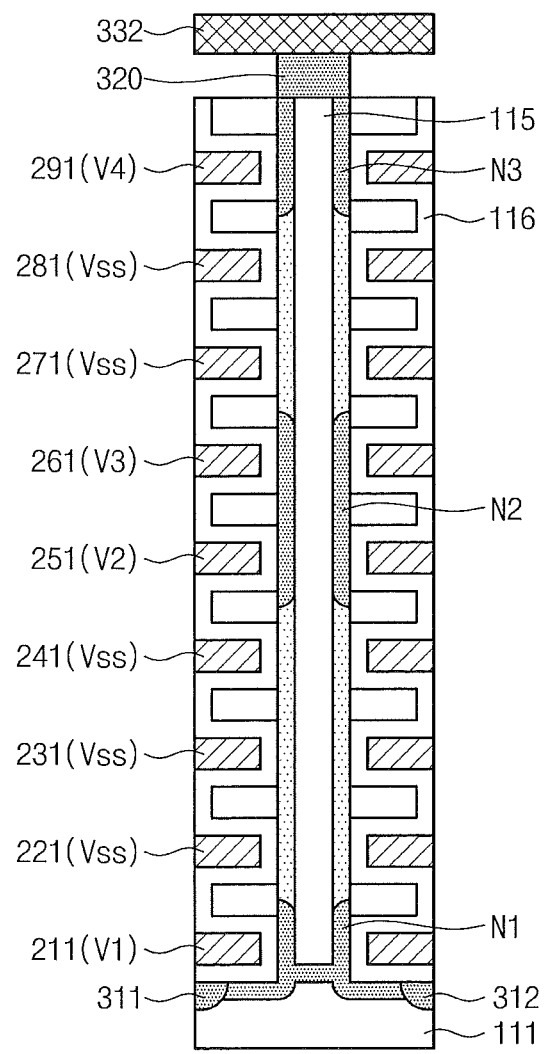

FIG. 7 is a cross-sectional view illustrating one NAND string NS of the memory block BLKi described with reference to FIGS. 3-6. For example, a NAND string NS12 of the first row and second column is illustrated. Referring to FIGS. 6 and 7, a ground voltage Vss may be applied to a first word line (WL1) 221, a second word line (WL2) 231, a third word line (WL3) 241, a sixth word line (WL6) 271, and a seventh word line (WL7) 281. A region of a body 114 of a second type corresponding to first to third memory cells MC1-MC3, and sixth and seventh memory cells MC6 and MC7 may maintain a first type (e.g., p-type).

For example, a first voltage V1 may be applied to a ground select line (GSL1) 211. A first voltage V1 may be a positive voltage of a higher level than that of a threshold voltage of a ground select transistor GST. A region of the body 114 of a second direction corresponding to the ground select transistor GST may be inverted to a second type (e.g., n-type) by the first voltage V1 (refer to N1). A channel N1 may be formed in the body 114 of the second direction corresponding to the ground select transistor GST.

The channel N1 of the ground select transistor GST may extend along the second direction due to the influence of a fringing field of the first voltage V1. For example, the channel N1 of the ground select transistor GST may be connected to first and second doping regions 311 and 312 due to the influence of the fringing field of the first voltage V1. The first and second doping regions 311 and 312, and the channel N1 of the ground select transistor GST may be controlled to be the same type (e.g., n-type). A common source line CSL and the channel N1 of the ground select transistor GST may be electrically connected to each other.

For example, a second voltage V2 may be applied to a fourth word line (WL4) 251 and a third voltage V3 may be applied to a fifth word line (WL5) 261. The second and third voltages V2 and V3 may be positive voltages of higher levels than those of the threshold voltages of the memory cells MC4 and MC5, respectively. The body 114 of the second direction of the fourth and fifth memory cells MC4 and MC5 may be inverted by the second and third voltages V2 and V3. Channels may be formed in the fourth and fifth memory cells MC4 and MC5. The channels of the fourth and fifth memory cells MC4 and MC5 may be connected to one channel N2 due to the influence of fringing fields of the second and third voltages V2 and V3.

For example, a fourth voltage V4 may be applied to a string select line (SSL1) 291. The fourth voltage V4 may be a positive voltage. The body 114 of the second direction of the string select transistor SST may be inverted. A channel N3 may be formed in the string select transistor SST. The channel N3 of the string select transistor SST may be connected to a drain 320 due to the influence of a fringing field of the fourth voltage V4. The channel N3 of the string select channel SST and the drain 320 may be electrically connected to each other.

When a positive voltage of a higher level than that of a threshold voltage of the ground select transistor GST is applied to the ground select line (GSL1) 211, the channel of the ground select transistor GST may be electrically connected to the common source line (CSL) including doping regions 311 and 312. When a positive voltage of a higher level than that of the threshold voltage of the string select transistor SST, the channel of the string select transistor SST may be connected to the drain 320. When a positive voltage of a higher level than that of the threshold voltages of the memory cells MC1-MC7 is applied to adjacent word lines WL, the channels of corresponding memory cells MC may be electrically connected.

The channel of the ground select transistor GST and the channels of the memory cells MC1-MC7 may be connected due to the influence of a fringing field. The channels of the string select transistor SST and the channels of the memory cells MC1-MC7 may be connected due to the influence of a fringing field. When positive voltages (voltage of a higher level that of a threshold voltage) are applied to the ground select line (GSL1) 211, the first to seventh word lines (WL1-WL7) 221-281, and the string select line (SSL) 291, the drain 320, the channel of the string select transistor SST, the channels of the memory cells MC1-MC7, the channel of the ground select transistor GST and common source line (CSL) doped regions 311-312 may be electrically connected. The NAND string NS12 may be selected.

For example, when a voltage lower than a threshold voltage of the string select transistor SST or the ground voltage Vss is applied to the string select line (SSL1) 291, a channel region of the string select transistor SST may not be inverted. Although a positive voltage is applied to the word lines (WL1-WL7) 211-281 and the ground select line (GSL) 211, the NAND string NS12 may be electrically isolated from the bit line (BL2) 332. The NAND string NS12 may be unselected.

Figure 8:
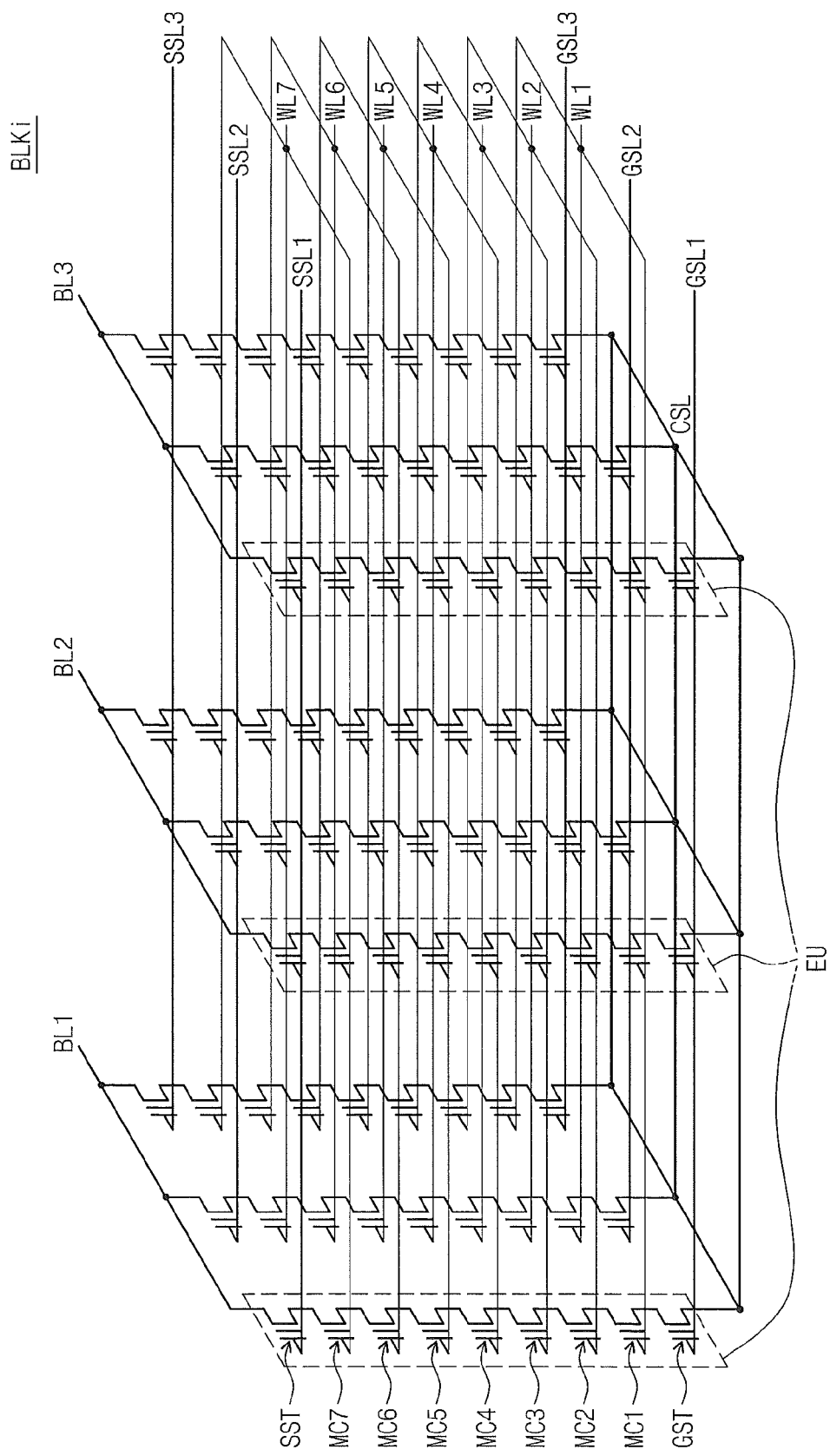

FIG. 8 is a circuit diagram illustrating an erase unit EU of the memory block BLKi of FIG. 6. Referring to FIG. 8, an erase operation may be performed by a unit of a row of NAND strings NS of a memory block BLKi, for example, by a unit of a ground select line GSL. FIG. 9 is a table illustrating erase operation voltage conditions of the erase unit EU of FIG. 8. Referring to FIGS. 8 and 9, the NAND strings NS may be divided into selected strings and unselected strings during an erase operation. The selected strings may represent NAND strings to be erased. The unselected strings may represent NAND string prohibited from being erased. For example, it will be described that NAND strings NS11-NS13 in the first row are selected, and NAND strings NS21-NS23 and NS31-NS33 of the second and third rows are unselected.

A string select line SSL1 of the selected NAND strings NS11-NS13 may be floated. A voltage of string select lines SSL2 and SSL3 of the unselected NAND strings NS21-NS23 and NS31-NS33 may be controlled from a ground voltage Vss to a second erase prohibition voltage Vm2. A ground voltage Vss may be applied to the word lines WL1-WL7 of the selected and unselected strings NS11-NS13, NS21-NS23 and NS31-NS33. A ground select line GSL1 of the selected strings NS11-NS13 may be floated. A voltage of ground select lines GSL2-GSL3 of the unselected strings NS21-NS23 and NS31-NS33 may be controlled from a ground voltage Vss to a first erase prohibition voltage Vm1. A common source line CSL may be floated and an erase voltage Vers may be applied to the substrate 111.

Figure 10:
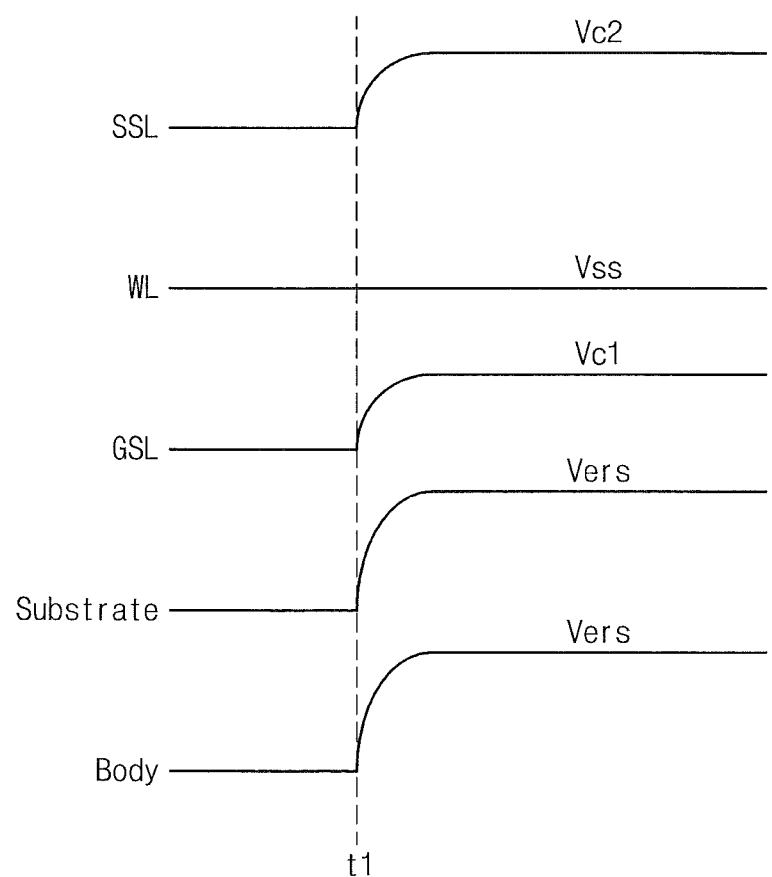
Figure 11:
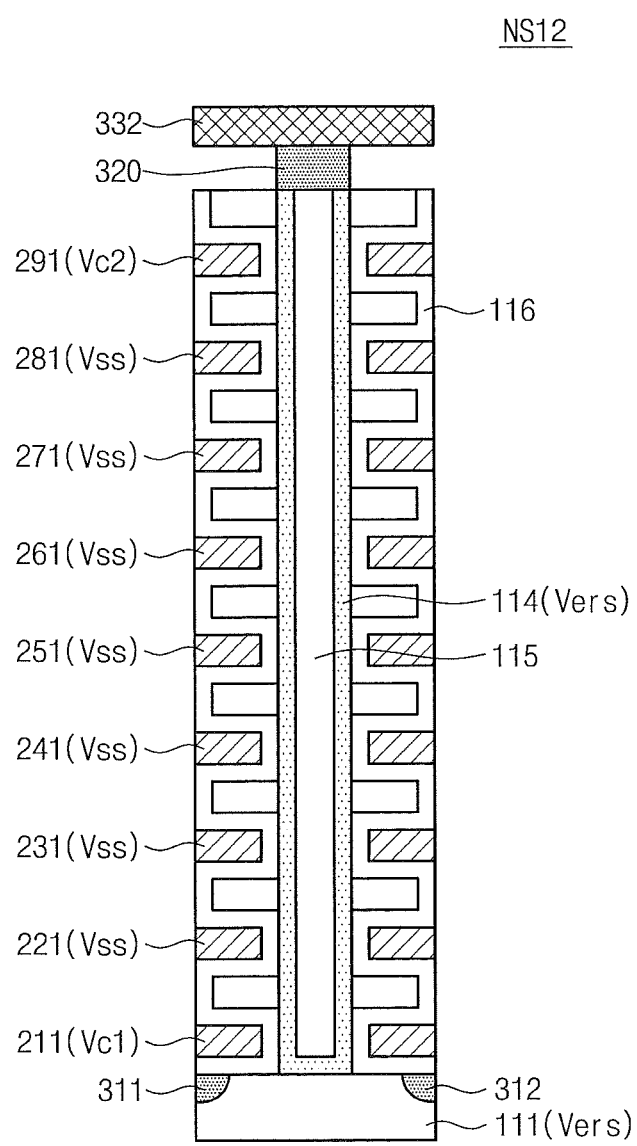

FIG. 10 is a timing diagram illustrating voltage variation of selected strings NS11-NS13 according to the voltage conditions of FIG. 9. FIG. 11 is a cross-sectional diagram illustrating the state of the selected string NS12 according to the voltage variation of FIG. 10. Referring to FIGS. 10 and 11, an erase voltage Vers may be applied to a substrate 111 at a first time t1. The substrate 111 and a body 114 of a second direction may be silicon materials doped with the same type (e.g., p-type). The erase voltage Vers may be delivered to the body 114 of the second direction. A ground voltage Vss may be applied to word lines (WL1-WL7) 221-281. The ground voltage Vss may be applied to a gate (e.g., control gate) of memory cells MC1-MC7 and the erase voltage Vers may be applied to the body 114 of the second direction. The memory cells MC1-MC7 may biased according to Fowler-Nordheim tunneling.

The ground select line (GSL1) 211 may be floated. When a voltage of the body 114 of the second direction is changed into the erase voltage Vers, a voltage of the ground select line (GSL1) 211 may also be changed by coupling. For example, the voltage of the ground select line (GSL1) 211 may be changed into a first coupling voltage Vc1. A voltage difference between the first coupling voltage Vc1 and the erase voltage Vers may be smaller than a voltage difference between the ground voltage Vss and the erase voltage Vers. Fowler-Nordheim tunneling may not be generated. The ground select transistor GST may be prohibited from being erased. Similarly, a voltage of a string select line (SSL1) 291 may be changed into a second coupling voltage Vc2. The string select transistor SST may be prohibited from being erased.

For example, the body 114 of the second direction may be silicon material of a first type (e.g., p-type), and the drain 320 may be silicon material of a second type (e.g., n-type). The body 114 of the second direction and the drain 320 may form a p-n junction. Accordingly, the erase voltage Vers applied to the body 114 of the second direction may be delivered to a bit line (BL2) 332 through the drain 320.

Figure 12:
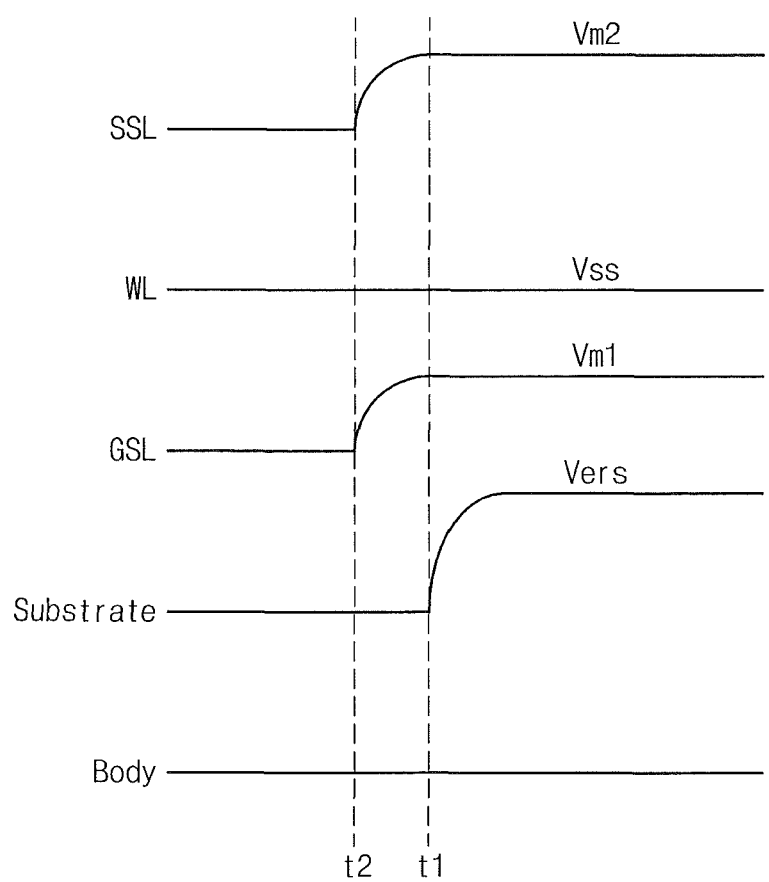
Figure 13:
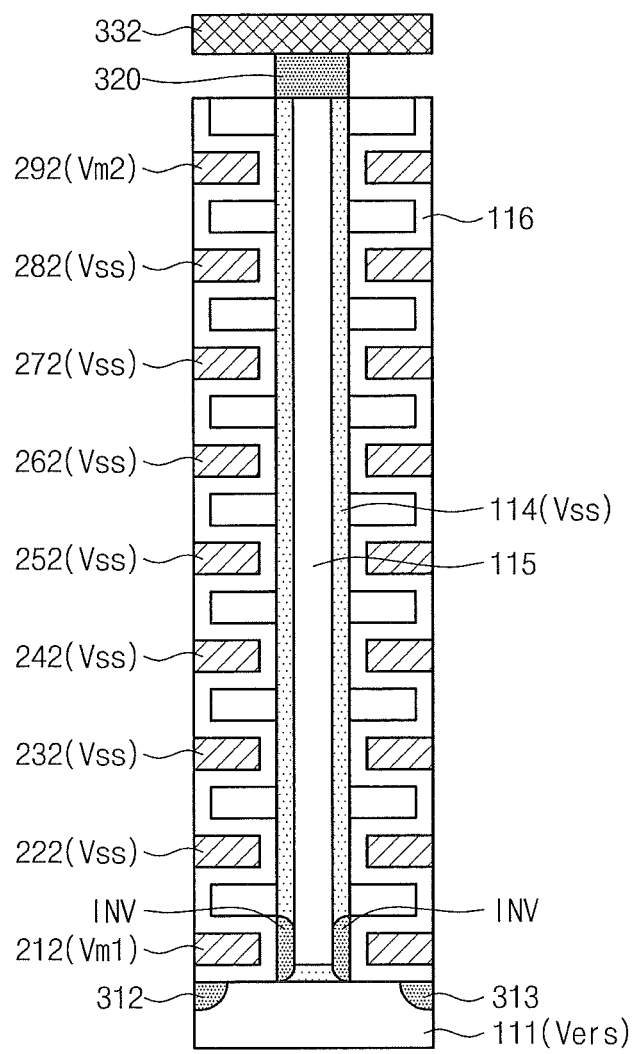

FIG. 12 is a timing diagram illustrating voltage variation of unselected strings NS21-NS23 and NS31-NS33 according to the voltage conditions of FIG. 9. FIG. 13 is a cross-sectional diagram illustrating the state of the unselected string NS22 according to the voltage variation of FIG. 12. Referring to FIGS. 12 and 13, a first erase prohibition voltage Vm1 may be applied to a ground select line (GSL2) 212 at a second time t2. For example, the first erase prohibition voltage Vm1 may be set to generate a channel INV of the ground select transistor GST. The channel INV of the ground select transistor GST may electrically isolate a body 114 of a second direction from the substrate 111. Although an erase voltage Vers is applied to the substrate 111 at a first time t1, the erase voltage Vers may not be delivered to the body 114 of the second direction. Although a ground voltage Vss is applied to word lines WL1-WL7, memory cells MC1-MC7 may not be erased.

As described with reference to FIGS. 10 and 11, the erase voltage Vers may be delivered to a bit line (BL2) 332. A high voltage may be delivered to the bit line (BL2) 332. The high voltage of the bit line (BL2) 332 may be delivered to a drain 320. When the voltage level of a string select line (SSL2) 292 is low a Gate Induced Drain Leakage (GIDL) may be generated between the string select line (SSL2) 292 and the drain 320. When GIDL is generated, hot holes may be generated. The generated hot holes may be injected into the body 114 of the second direction. Because a current flow is generated between the drain 320 and the body 114 of the second direction, a high voltage may be delivered to the body 114 of the second direction. When a voltage of the body 114 of the second direction rises, the memory cells MC1 to MC7 may be erased.

In order to prevent the above limitation, a second erase prohibition voltage Vm2 may be applied to the string select line (SSL2) 292. The second erase prohibition voltage Vm2 may be a positive voltage. The second erase prohibition voltage Vm2 may be set to prevent GIDL between the drain 320 and the string select line (SSL2) 292. For example, the second erase prohibition voltage Vm2 may have a level lower than that of a threshold voltage of the string select transistor SST. The second erase prohibition voltage Vm2 may have a level higher than that of the threshold voltage of the string select transistor SST. The second erase prohibition voltage Vm2 may be applied to a string select line (SSL1) 292 at a second time t2. The second erase prohibition voltage Vm2 may be applied to the string select line (SSL1) 292 before the first time t1.

Figure 14:
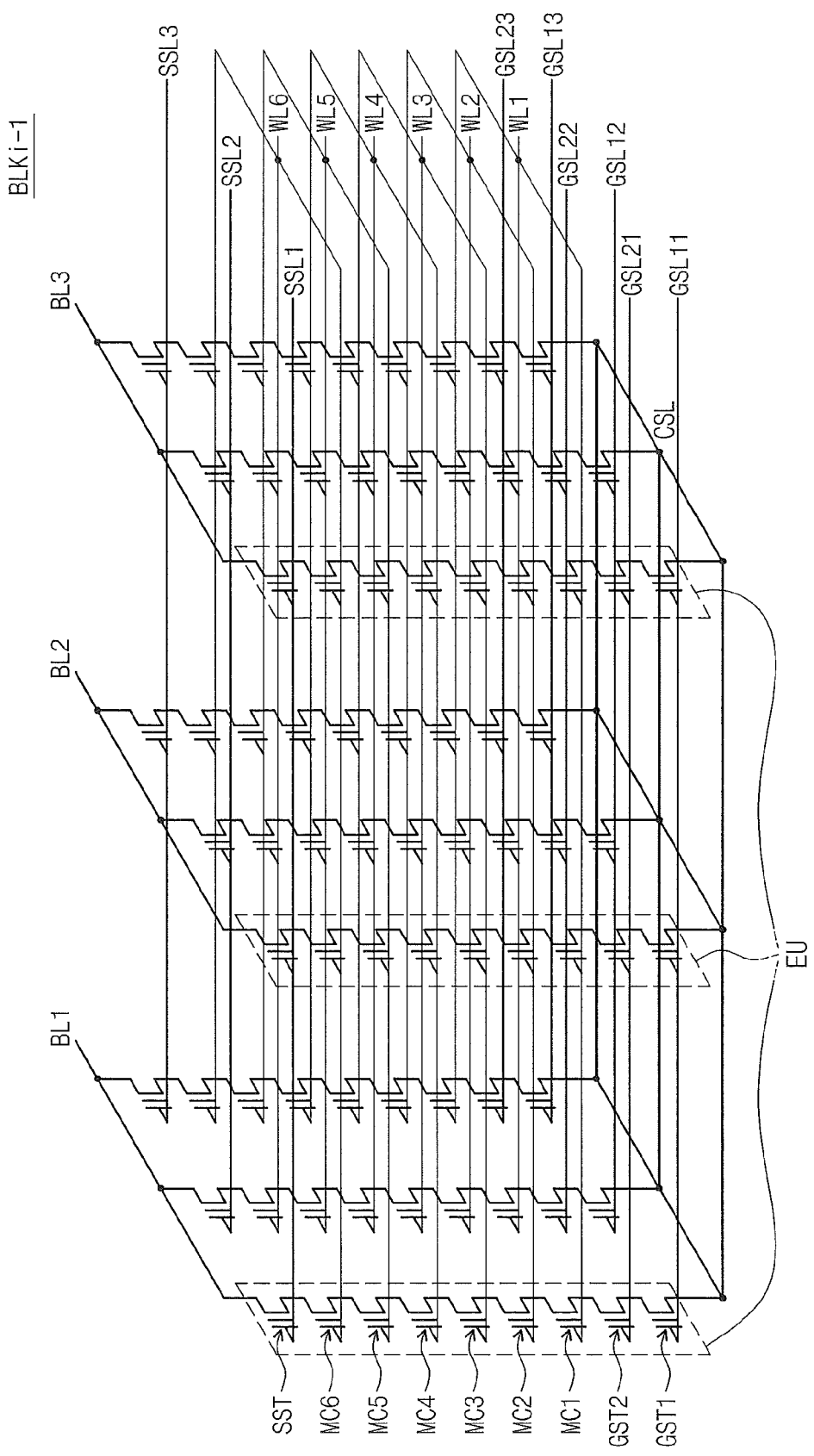

FIG. 14 is a circuit diagram illustrating the memory block BLKi of FIG. 6 according to example embodiments of the inventive concepts. Comparing to the memory block BLKi of FIG. 6, two ground select lines are between the word lines WL1-WL6 and a common source line CSL in each NAND string NS of a memory block BLKi-1. For example, NAND strings NS11-NS13 of the first row may be connected to ground select lines GSL11 and GSL21. NAND strings NS21-NS23 of the second row may be connected ground select lines GSL12 and GSL22. NAND strings NS31-NS33 of the third row may be connected to ground select lines GSL13 and GSL23. During an erase operation, except that the ground select lines GSL11 and GSL21 are floated, voltage conditions of the selected strings NS11-NS13 may be similar to those described with reference to FIGS. 9-13.

Figure 15:
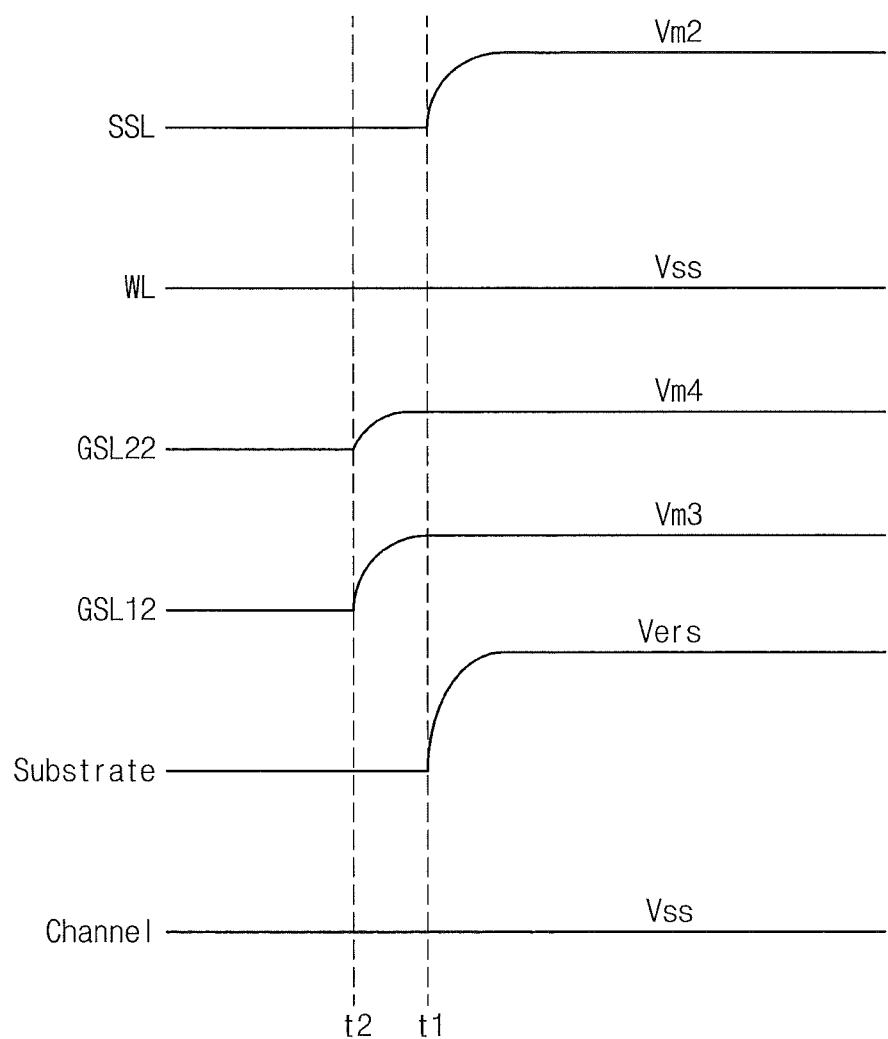

FIG. 15 is a timing diagram illustrating voltage variation of unselected strings NS21-NS23 and NS31-NS33 of FIG. 14 during an erase operation. Referring to FIGS. 14 and 15, a voltage variation of the unselected strings NS21-NS23 and NS31-NS33 may be similar to those described with reference to FIGS. 9-13, except a voltage variation of the ground select lines GSL12, GSL22, GSL13, and GSL23. Upon erase operation, a third erase prohibition voltage Vm3 may be applied to the ground select lines GSL12 and GSL13 adjacent to the common source line, and a fourth erase prohibition voltage Vm4 may be applied to the ground select lines GSL22 and GSL23 adjacent to the word lines WL1-WL6.

For example, the third erase prohibition voltage Vm3 may have a level higher than the fourth erase prohibition voltage Vm4. The third erase prohibition voltage Vm3 may have a level higher than that of the first erase voltage Vm1 described with reference to FIGS. 9-13. A voltage difference between the ground select lines GSL12 and GSL13 adjacent to the common source line CSL and the substrate 111 may be smaller than a voltage difference between the substrate 111 and the ground select line GSL described with reference to FIGS. 9-13. GIDL due to the voltage difference between the ground select lines GSL12 and GSL13 adjacent to the common source line CSL and the substrate 111 may be reduced.

Although it has been described in FIGS. 14 and 15 that two ground select lines GSL are in each NAND string NS, one ground select line GSL adjacent to the common source line CSL, and one dummy word line adjacent to the ground select line GSL may be in each NAND string NS.

Figure 16:
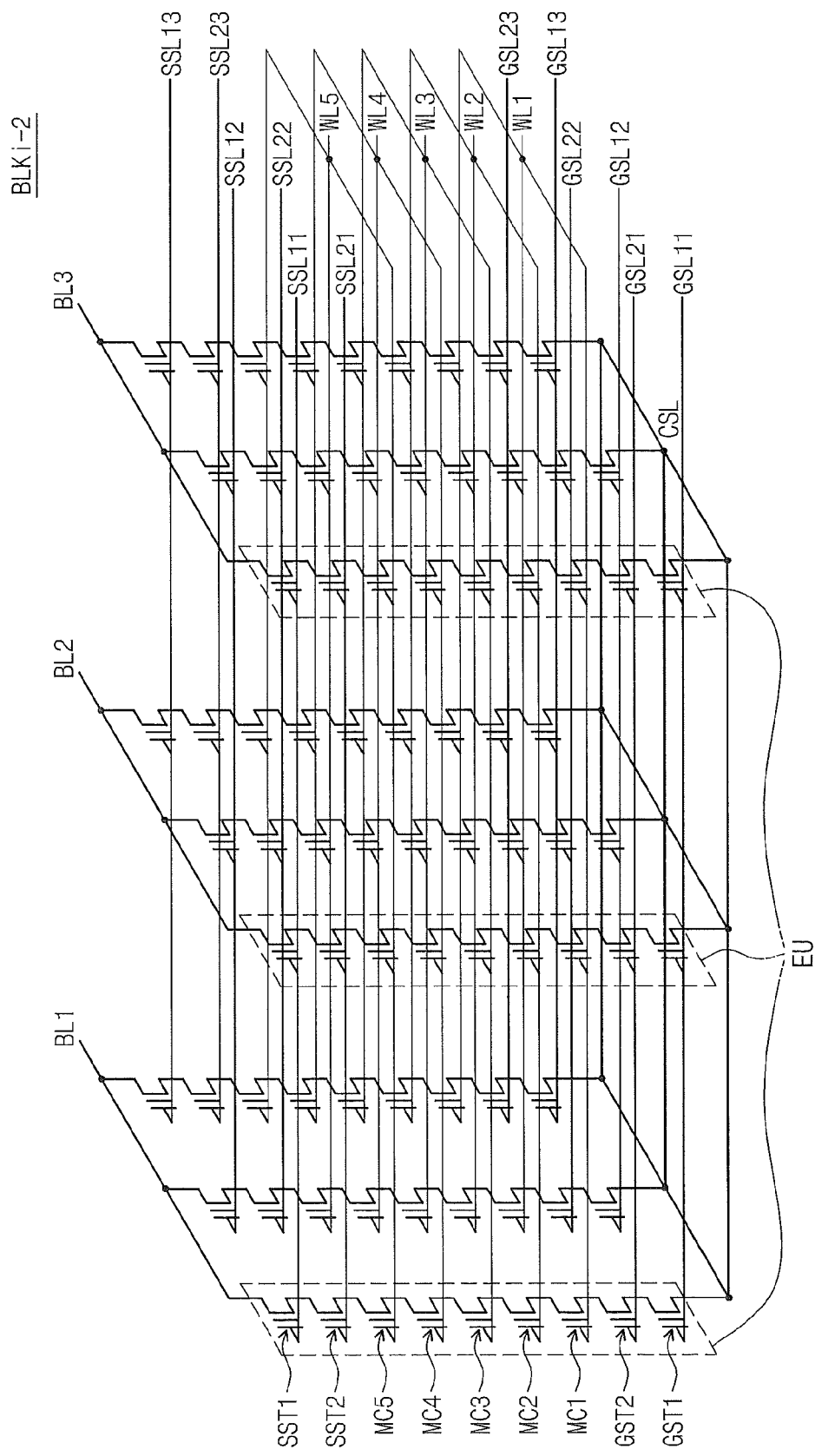

FIG. 16 is a circuit diagram illustrating a memory block BLKi of FIG. 6 according to example embodiments. Compared to the memory block BLKi-1, two string select lines may be between word lines WL1-WL5 and a bit line BL in each NAND string NS of a memory block BLKi-2 of FIG. 16. Similarly to those described by referring to the ground select lines GSL12, GSL22, GSL13, and GSL23 of the unselected strings NS21-NS23 and NS31-NS33 of FIGS. 14 and 15, different voltages may be provided to the string select lines SSL12, SSL22, SSL13, and SSL23 of the unselected strings NS21-NS23 and NS31-NS33.

For example, in each unselected NAND string NS, a first string voltage may be applied to a string select line adjacent to a bit line BL, and a voltage of a lower level than that of a first string voltage may be applied to a string select line adjacent to word lines WL. For example, the levels of the first and second string voltages may be set to prevent GIDL between a bit line BL and/or a drain 320 and a body 114 of a second direction. Similarly to those described with reference to FIGS. 14 and 15, one string select line SSL and a dummy word line adjacent to the string select line SSL may be in each NAND string NS.

Figure 17:
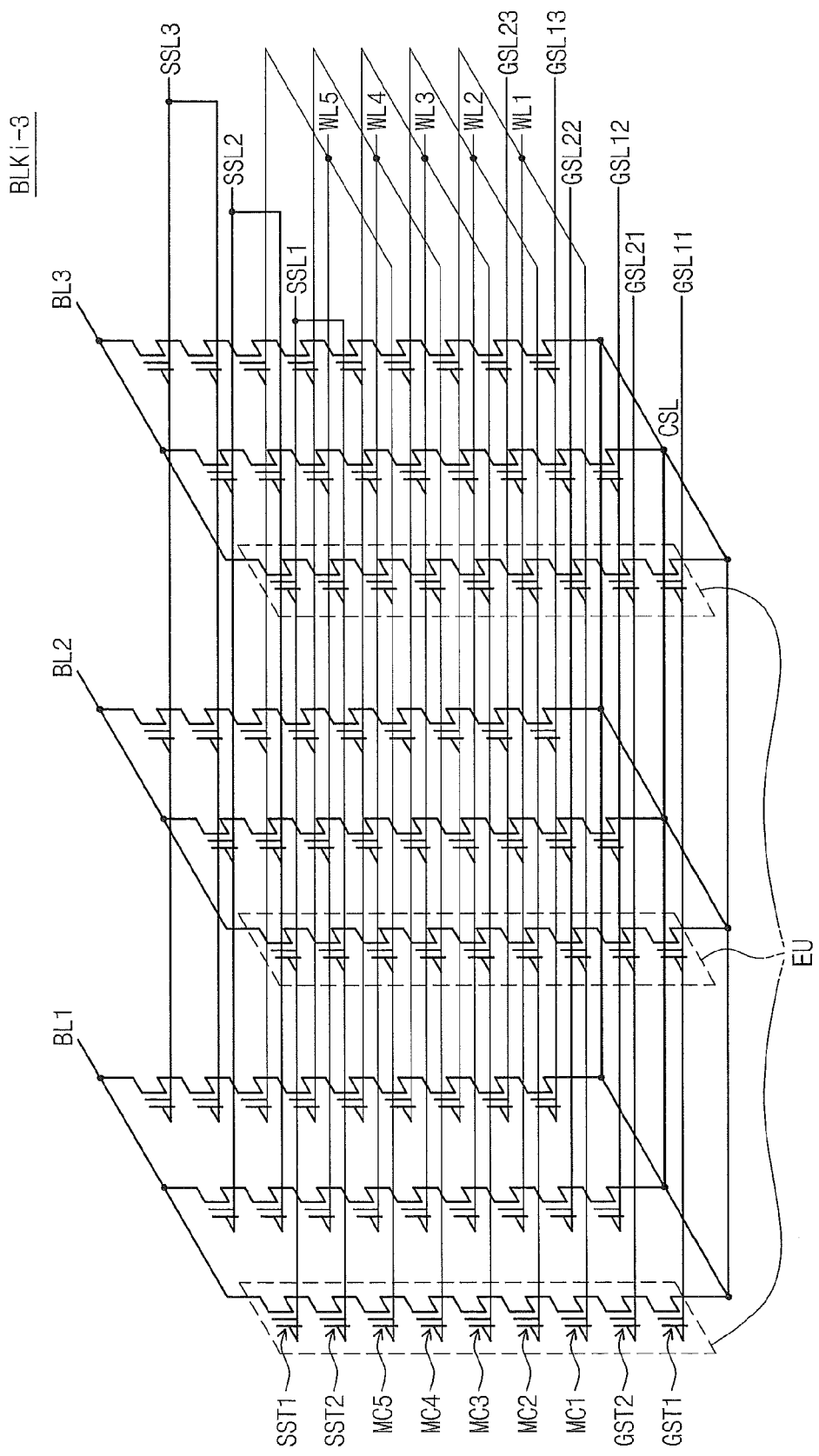

FIG. 17 is a circuit diagram illustrating a memory block BLKi of FIG. 6 according example embodiments of the inventive concepts. Compared to the memory block BLKi-2, string select lines SSL may be electrically connected in each NAND string NS of a memory block BLKi-3. The memory blocks BLKi and BLKi-1 to BLKi-3 in which one or two string select lines SSL and/or one or two ground select lines GSL are in each NAND string have been described with reference to FIGS. 9-17. It will be understood that three or more string select lines or ground select lines may be in each NAND string. As at least two string select lines SSL may be electrically connected to each other in each NAND string NS according to example embodiments described with respect to FIG. 17, so at least two may be electrically connected to each other in each NAND string NS.

For example, at least two ground select lines GSL may be in each NAND string NS. One ground select line GSL and at least one dummy word line adjacent to the ground select line GSL may be provided to each NAND string NS. At least one ground select line GSL and at least one dummy word line may be provided to each NAND string NS. At least two string select lines SSL and/or at least two dummy word lines may be electrically connected. At least two string select lines SSL may be provided to each NAND string NS. At least one string select line SSL and at least one dummy word line may be provided to each NAND string NS. At least one string select line SSL and at least one dummy word line may be provided to each NAND string NS. At least two ground select lines GSL and at least two dummy word lines may be electrically connected.

Figure 18:
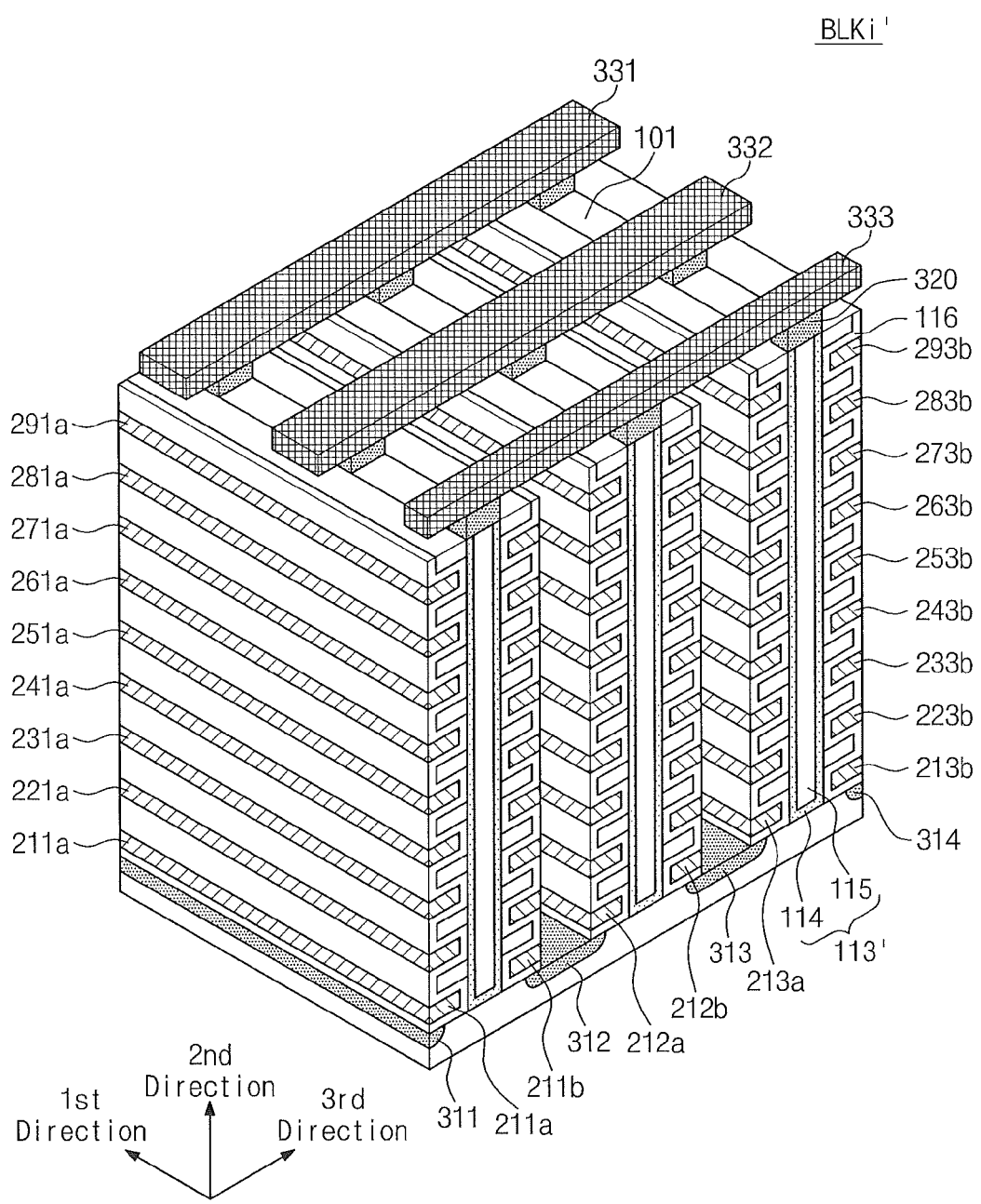

FIG. 18 is a perspective view illustrating a memory block BLKi' of FIG. 3 according to example embodiments of the inventive concepts. Compared to the memory block BLKi of FIG. 3, pillars 113' may be in a square pillar shape. Insulating materials 101 may be between the pillars 113' disposed along a first direction. For example, the insulating materials 101 may extend in a second direction to be connected to a substrate 111. The insulating materials 101 may extend in the first direction at a region except a region where the pillars 113' are provided. Conductive materials 211-291, 212-292 and 213-293 extending in the first direction described with reference to FIG. 3 may be separated into two portions 211a-291a and 211b-291b, 212a-292a and 212b-292b, and 213a-293a and 213b-293b by the insulating materials 101. The separated portions 211a-291a and 211b-291b, 212a-292a and 212b-292b, and 213a-293a and 213b-293b of the conductive materials may be electrically insulated.

In the first and second doping regions 311 and 312, each pillar 113' may be one NAND string NS along with portions 211a-291a of the conductive materials extending in the first direction and an insulation layer 116, and may be another NAND string NS along with portions 211b-291b of the conductive materials extending in the first direction and the insulating layer 116. In the second and third doping regions 312 and 313, each pillar 113' may be one NAND string NS along with portions 212a-292a of the conductive materials extending in the first direction and the insulation layer 116, and may be another NAND string NS along with the portions 212b-292b of the conductive materials extending in the first direction and the insulating layer 116.

In the third and fourth doping regions 313 and 314, each pillar 113' may be one NAND string NS along with portions 213a-293a of the conductive materials extending in the first direction and an insulation layer 116, and may be another NAND string NS along with the other portions 213b-293b of the conductive materials extending in the first direction and the insulating layer 116. Each pillar 113' may form two NAND strings NS by electrically insolating the conductive materials 211a-291a from the conductive materials 211b-291b extending in the first direction so that there is a NAND string on both sides of each pillar 113' using the insulating layer 101.

Similarly to example embodiments described with reference to FIGS. 5-17, an erase operation may be performed by a unit of a row of the NAND strings NS in the memory block BLKi' by controlling a voltage provided to a ground select line GSL of unselected NAND strings NS during an erase operation. Similarly to example embodiments described with reference to FIGS. 5-17, GIDL may be prevented between a bit line BL and/or a drain 320 and a string select transistor SST by controlling a voltage of a string select line SSL of the unselected NAND strings NS during an erase operation. Similarly to example embodiments described with reference to FIGS. 5-17, at least one string select line SSL and at least one ground select line GSL may be provided to each NAND string NS. Similarly to example embodiments described with reference to FIGS. 5-17, when two or more select lines are provided to each NAND string, the levels of voltages provided to the select lines may be different.

Figure 19:
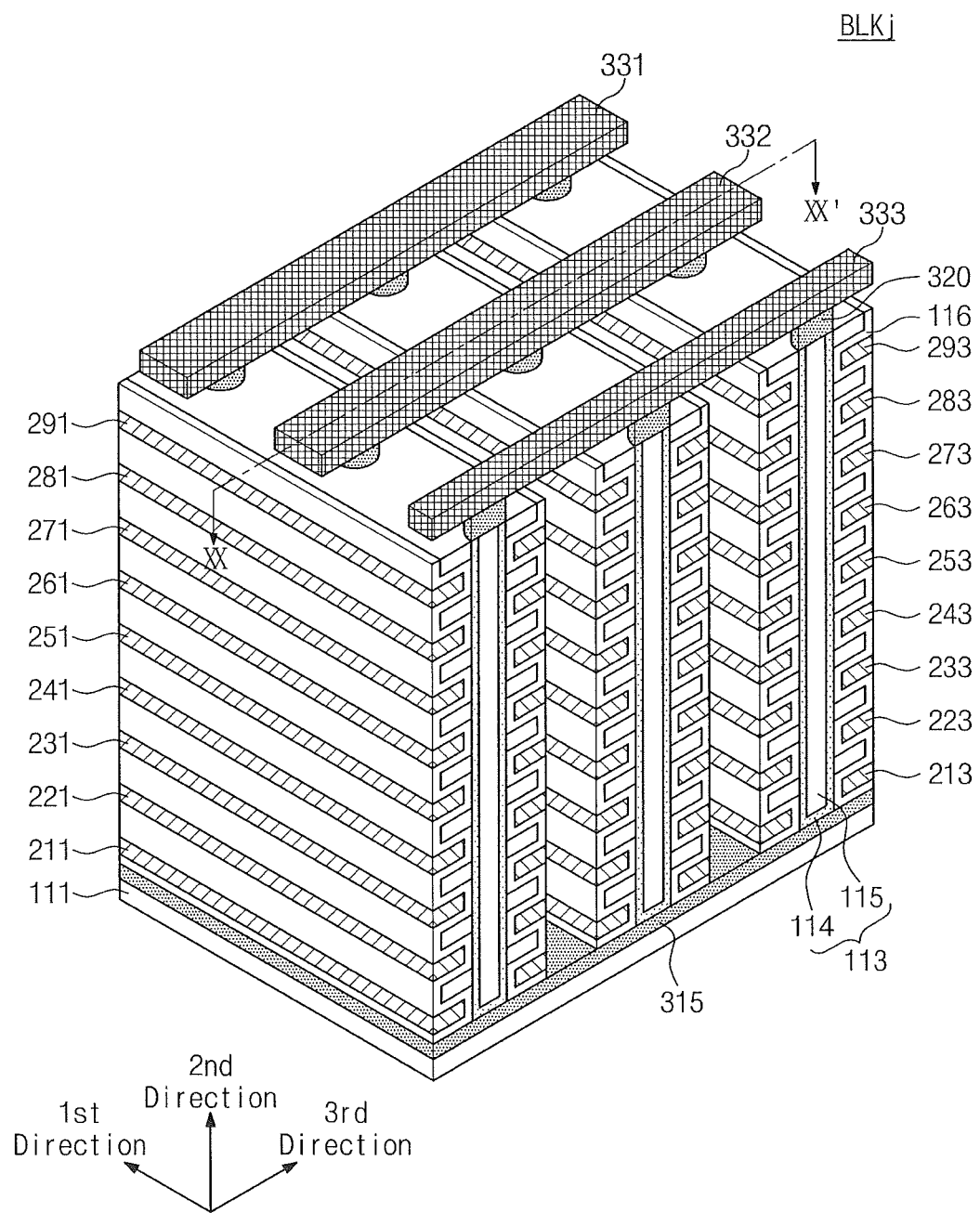
Figure 20:
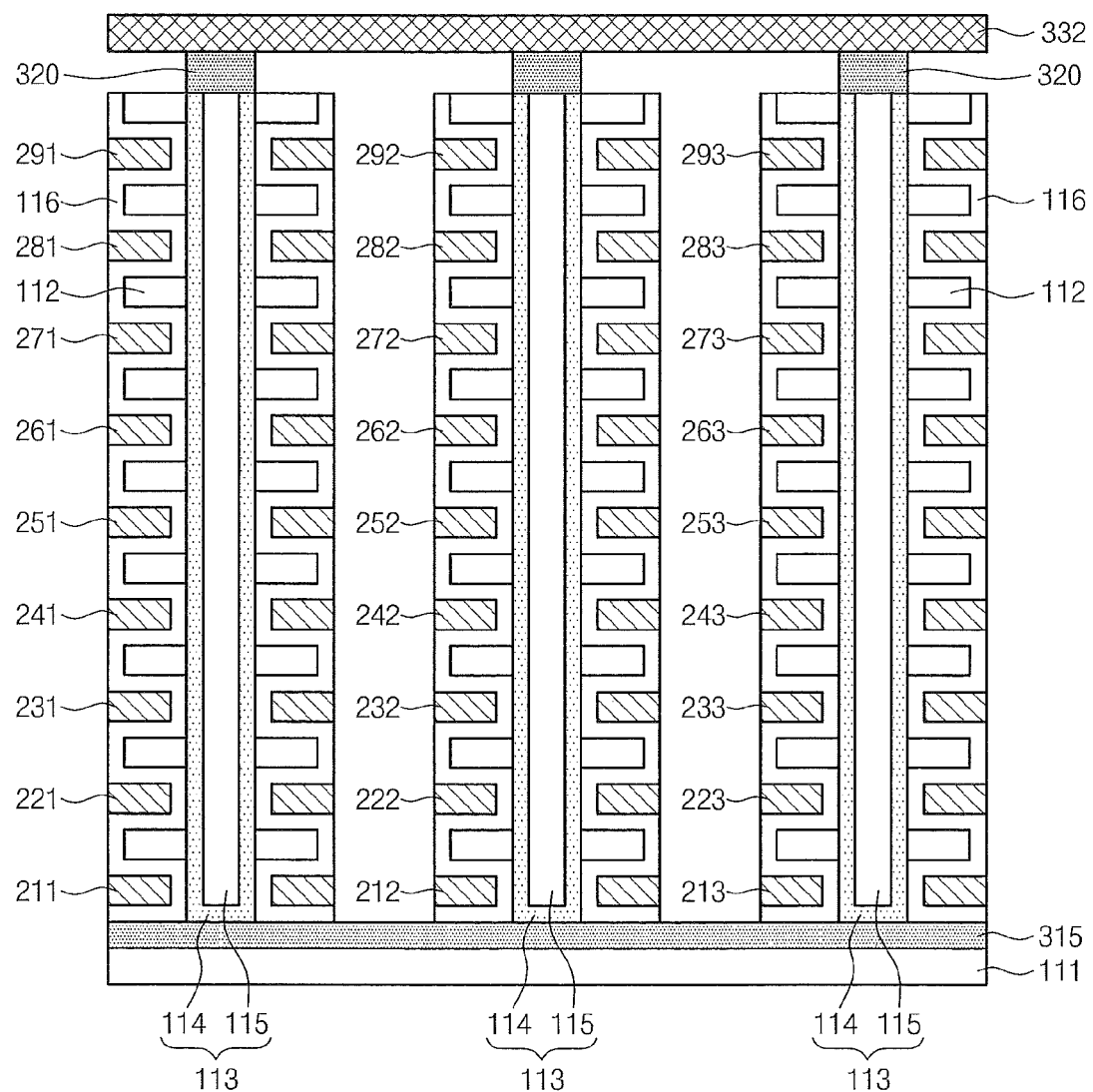

FIG. 19 is a perspective view illustrating one memory block BLKj among the memory blocks BLK1-BLKz of FIG. 2 according to a second embodiment. FIG. 20 is a cross-sectional view taken along the line XX-XX' of FIG. 19. Referring to FIGS. 19 and 20, the memory block BLKj may be configured similarly to those described with reference to FIGS. 4-17, except that a second type well 315 of a substrate 111 is a plate type conductor under pillars 113. FIG. 21 is a table illustrating erase operation voltage of the memory block BLKj of FIGS. 19 and 20. Referring to FIGS. 8 and 19-21, NAND strings NS11-NS13 of a first row will be described as being selected, and NAND strings NS21-NS23 and NS31-NS33 of second and third rows will be described as being unselected.

A string select line SSL1 of the selected strings NS11-NS13 may be floated. A voltage of string select lines SSL2 and SSL3 of the unselected strings NS21-NS23 and NS31-NS33 may be controlled from a ground voltage Vss to a sixth erase prohibition voltage Vm6. Word lines WL1-WL7 of the selected and unselected strings NS11-NS13, NS21-NS23, and NS31-NS33 may be controlled from a floating state to the ground voltage Vss. A ground select line GSL1 of the selected strings NS11-NS13 may be controlled from the ground voltage Vss to the floating state. Ground select lines GSL2 and GSL3 of the unselected strings NS21-NS23 and NS31-NS33 may be controlled from the ground voltage Vss to a fifth erase prohibition voltage Vm5. A common source line CSL may be floated. A voltage of the substrate 111 may be controlled from a pre-voltage Vpre to an erase voltage Vers.

Figure 22:
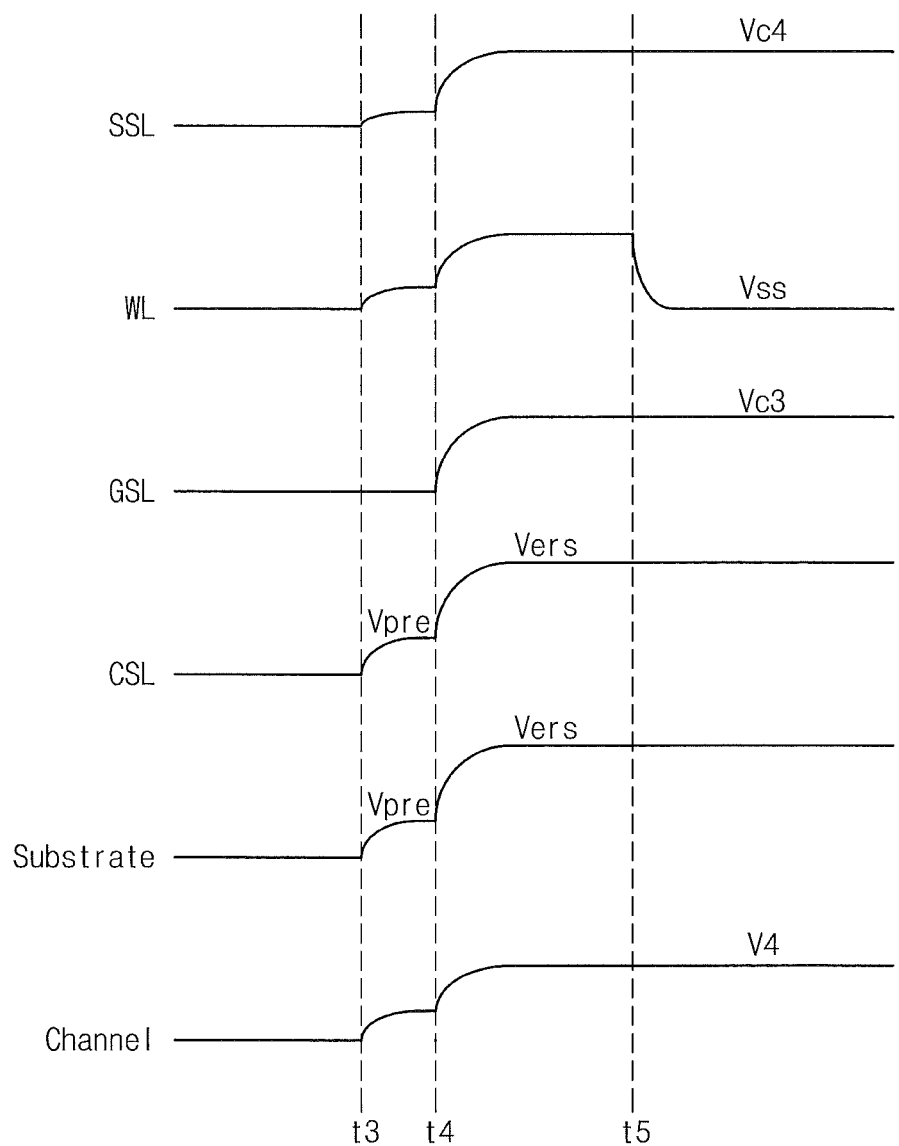
Figure 23:
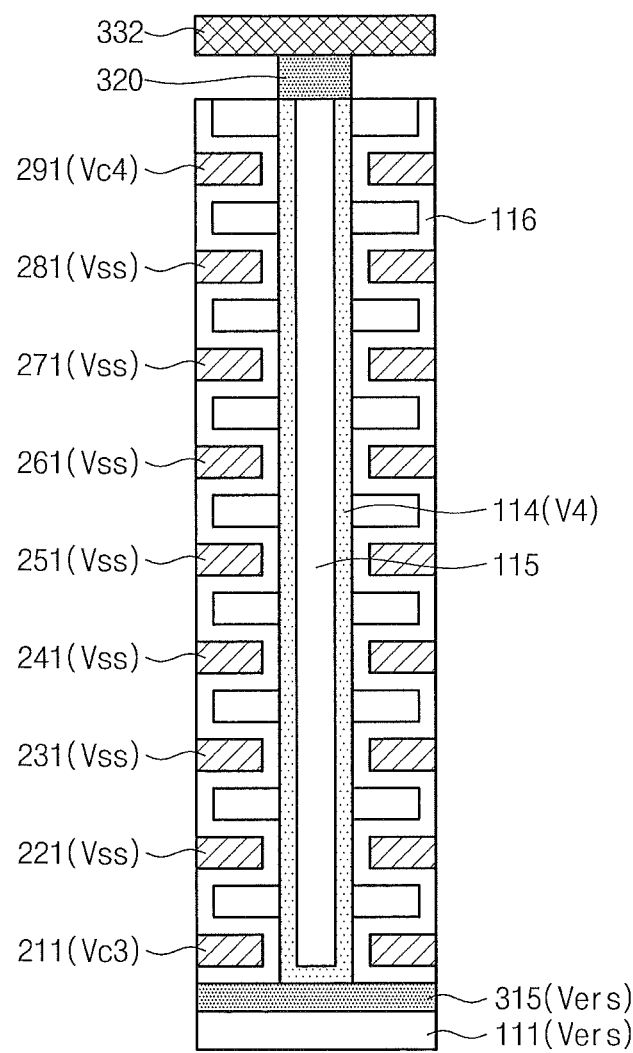

FIG. 22 is a timing diagram illustrating voltage variation of the selected strings NS11-NS13 according to the voltage conditions of FIG. 21. FIG. 23 is a cross-sectional diagram illustrating the state of one selected string NS12 among the selected strings NS11-NS13 according to the voltage variation of FIG. 22. Referring to FIGS. 21 and 22, a pre-voltage Vpre may be applied to a substrate 111 at a third time t3. The substrate 111 may be doped with a first type (e.g., p-type), and a common source line (CSL) 315 may be doped with a second type (e.g., n-type). The substrate 111 and the common source line (CSL) 315 may form a p-n junction. The pre-voltage (Vpre) applied to the substrate 111 may be delivered to the common source line (CSL) 315.

The pre-voltage Vpre may be delivered to the common source line (CSL) 315 and a ground voltage Vss may be applied to the ground select line (GSL1) 211. Hot holes may be generated by a voltage difference between the common source line (CSL) 315 and the ground select line (GSL1) 211. The generated hot holes may be delivered to a channel region 114. A current flow may be generated from the common source line CSL to the channel region 114. A voltage of the channel region 114 may rise. As the voltage of the channel region 114 rises coupling may be generated. Voltages of the word lines (WL1-WL7) 221-281 and the string select line (SSL1) 291 may be increased by an influence of the coupling.

The ground select line (GSL1) 211 may be floated at a fourth time t4, and the erase voltage Vers may be applied to the substrate 111. The erase voltage Vers applied to the substrate 111 may be delivered to the common source line (CSL) 315. Because the voltage of the common source line (CSL) 315 rises, the voltage difference between the common source line (CSL) 315 and the ground select line (GSL1) 211 may increase. Hot holes may be continuously generated between the common source line (CSL) 315 and the ground select line (GSL1) 211. The generated hot holes may enter the channel region 114. The voltage of the channel region 114 may rise.

Because the ground select line (GSL1) 211 is floated the ground select line (GSL1) 211 may also be affected by coupling. For example, the ground select line (GSL1) 211 may be affected by coupling from the common source line (CSL) 315 and the channel region 114. The voltage of the ground select line (GSL1) 211 may rise. The ground voltage Vss may be applied to the word lines (WL1-WL7) 221-281 at a fifth time t5. The voltage of the channel region 114 may rise to a fourth voltage V4. Fowler-Nordheim tunneling may be generated by a voltage difference between the word lines (WL1-WL7) 221-281 and the channel region 114. Memory cells MC1-MC7 may be erased.

The voltage of the ground select line (GSL1) 211 may rise to a third coupling voltage Vc3 due to coupling. For example, a voltage difference between the third coupling voltage Vc3 and the fourth voltage V4 may not cause Fowler-Nordheim tunneling. A ground select transistor GST may be prevented from being erased. The voltage of the string select line (SSL1) 291 may rise to a fourth coupling voltage Vc4 due to coupling. For example, a voltage difference between the fourth coupling voltage Vc4 and the fourth voltage V4 may not cause Fowler-Nordheim tunneling. A string select transistor SST may be prevented from being erased.

Figure 24:
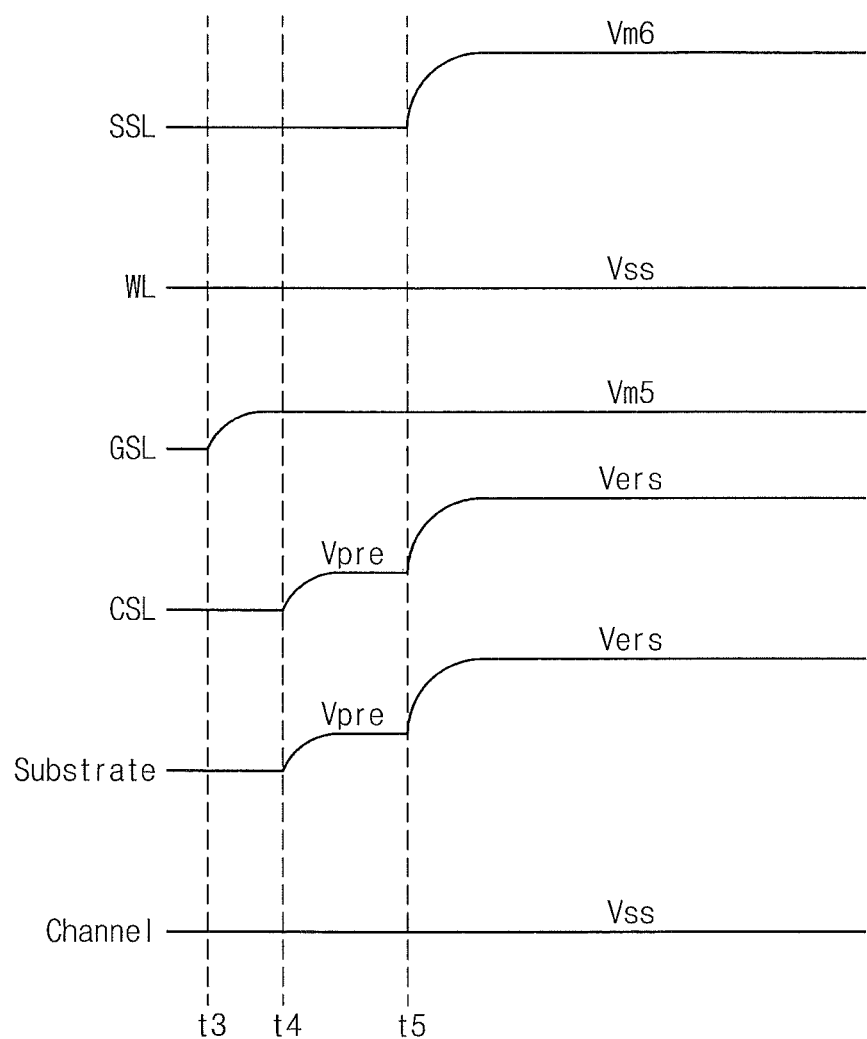
Figure 25:
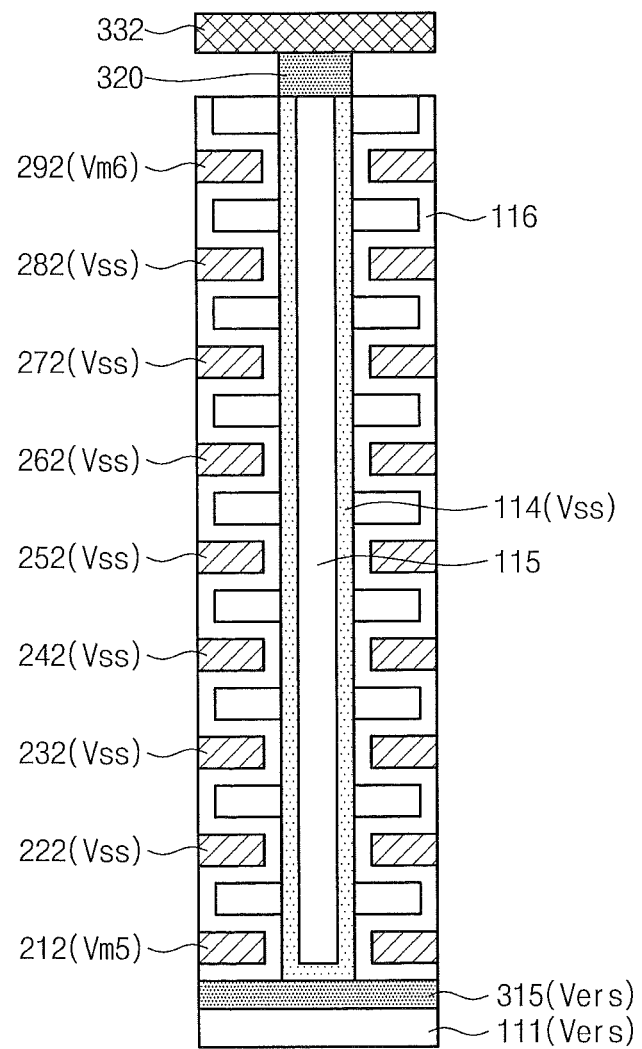

FIG. 24 is a timing diagram illustrating voltage variation of unselected strings NS21-NS23 and NS31-NS33 according to the voltage conditions of FIG. 22. FIG. 25 is a cross-sectional diagram illustrating the state of one unselected string NS22 among the unselected strings NS21-NS23 and NS31-NS33 according to the voltage variation of FIG. 24. Referring to FIGS. 8, 24, and 25, a first erase prohibition voltage Vm5 may be applied to a ground select line (GSL2) 212 at a fourth time t4. For example, the fifth erase prohibition voltage Vm5 may be set to prevent generation of hot holes due to a voltage difference between a common source line (CSL) and a ground select line (GSL2) 212. When the generation of the hot holes is prevented and/or reduced, the voltage of a channel region 114 may not vary. For example, the voltage of the channel region 114 may maintain a ground voltage Vss.

Similarly to those described with reference to FIGS. 4-17, a sixth erase prohibition voltage Vm6 may be applied to a string select line (SSL) 292 to prevent GIDL caused by a voltage difference between a drain 320 and a string select line (SSL2) 292. For example, the sixth erase prohibition voltage Vm6 may be applied at a fourth time t4, before the fifth time t5, and/or before the sixth time t6. Although it has been described in FIGS. 19-24 that a fifth erase prohibition voltage Vm5 is applied to the ground select lines GSL2 and GSL3 of the unselected strings NS21-NS23 and NS31-NS33, the level of the fifth erase prohibition voltage Vm5 applied to the ground select lines GSL2 and GSL3 may vary.

For example, the fifth erase prohibition voltage Vm5 may have a first level corresponding to a pre-voltage Vpre of the common source line CSL. The first level of the fifth erase prohibition voltage Vm5 may be set to prevent hot holes from being generated due to a difference between the pre-voltage Vpre and the first level of the fifth erase prohibition voltage Vm5. For example, the fifth erase prohibition voltage Vm5 may have a second level corresponding to an erase voltage Vers of the common source line CSL. A second level of the fifth erase prohibition voltage Vm5 may be set to prevent hot holes from being generated due to a difference between the erase voltage Vers and the second level of the fifth erase prohibition voltage Vm5.

Similarly to those described with reference to FIGS. 4-17, at least two ground select lines GSL may be included in each NAND string. One ground select line GSL and at least one dummy word line adjacent to the ground select line GSL may be included in each NAND string NS. At least one ground select line GSL and at least one dummy word line may be included in each NAND string NS. At least two string select lines SSL and/or at least two dummy word lines may be electrically connected. At least two string select lines SSL may be included in each NAND string NS. At least one string select line SSL and at least one dummy word line may be included in each NAND string NS. At least one string select line SSL and at least one dummy word line may be included in each NAND string NS. At least two ground select lines GSL and at least two dummy word lines may be electrically connected.

When two or more string select lines SSL are provided to each NAND string NS, the levels of the voltages applied to the string select lines SSL may be different. When two or more ground select lines GSL are provided to each NAND string NS the levels of the voltages applied to the ground select lines GSL may be different.

Figure 26:
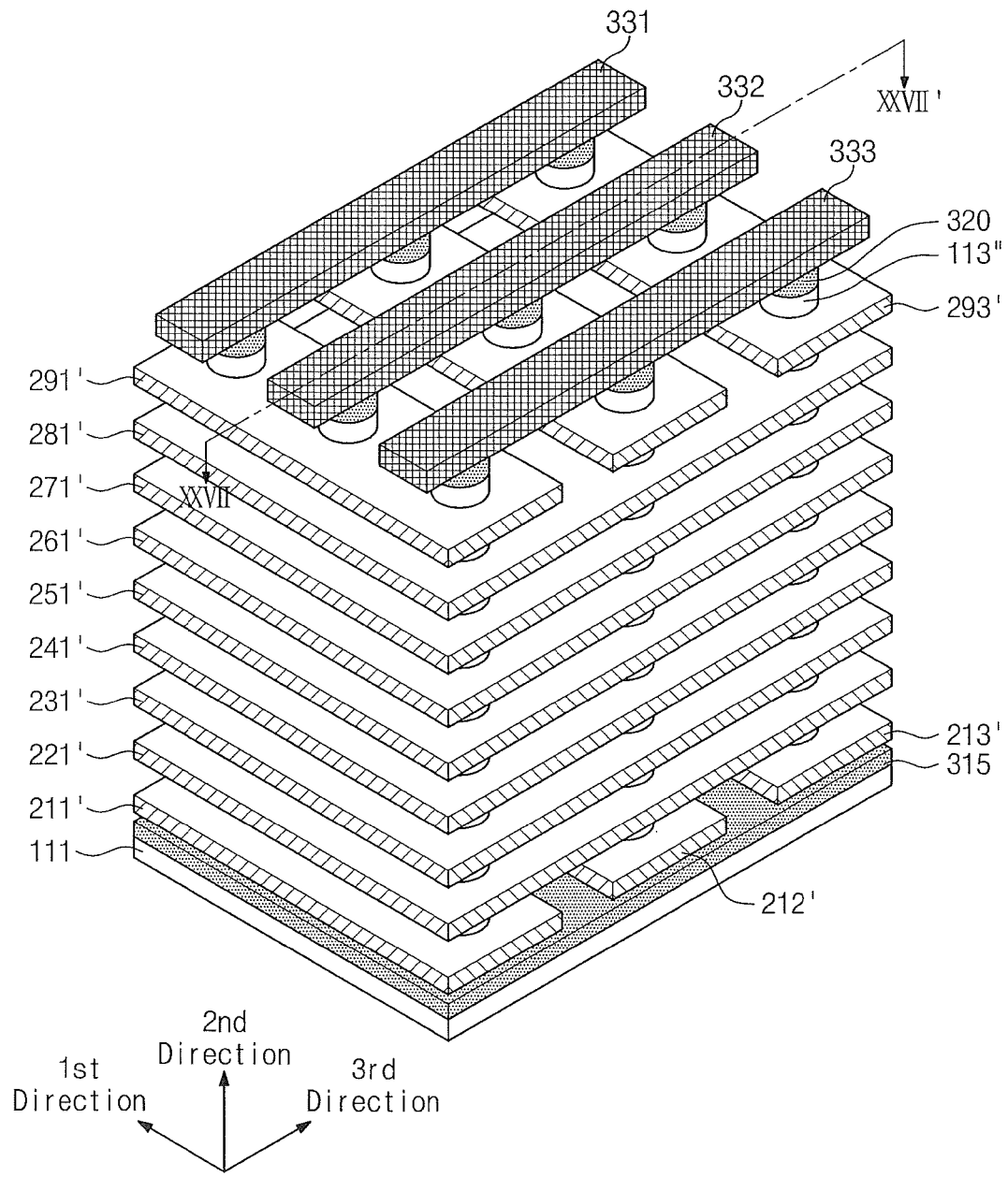
Figure 27:
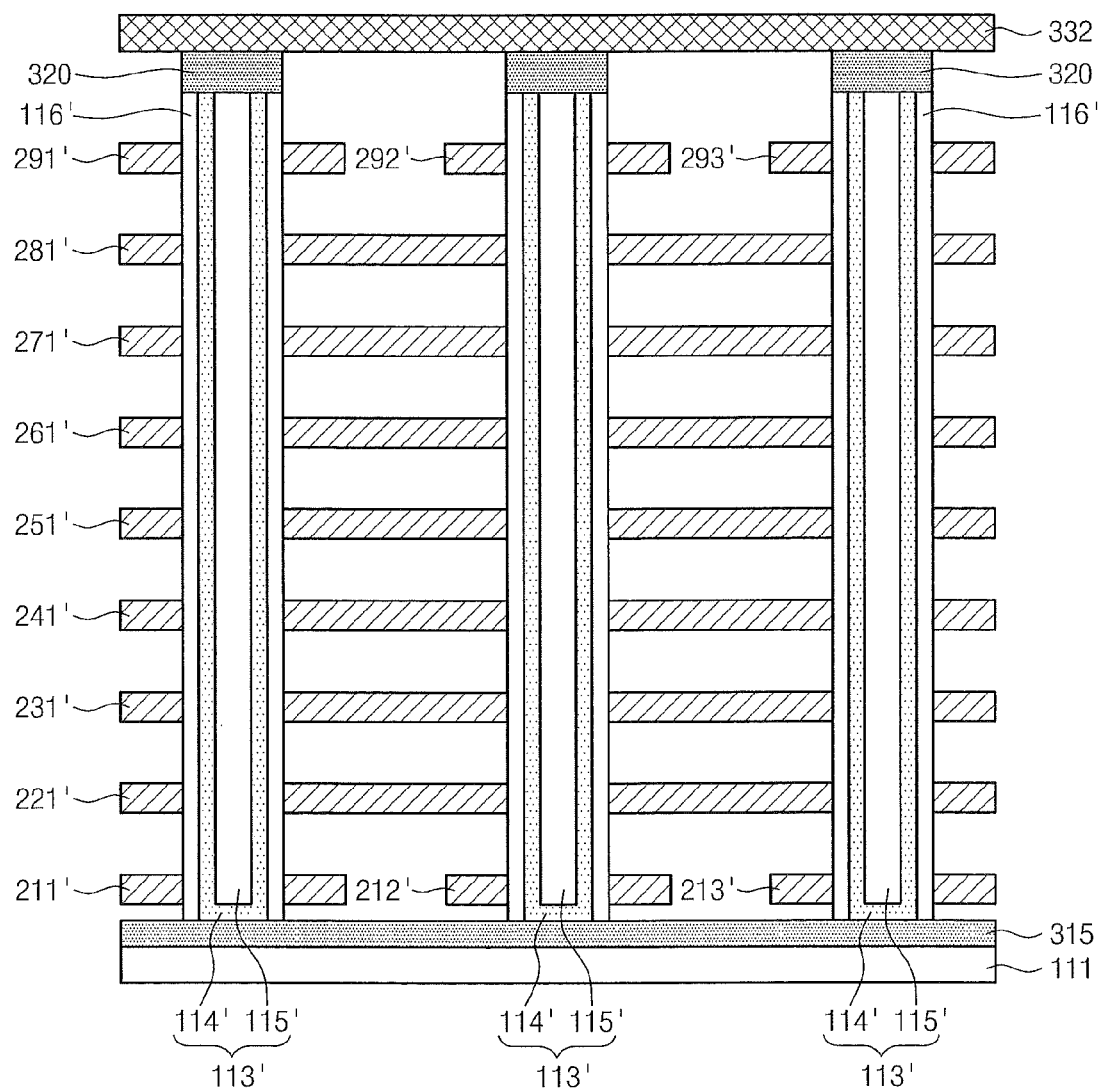

FIG. 26 is a perspective view illustrating one memory block BLKp among the memory blocks BLK1-BLKi of FIG. 2 according to example embodiments of the inventive concepts. FIG. 27 is a cross-sectional view taken along the line XXVII-XXVII' of FIG. 26. Referring to FIGS. 26 and 27, word lines 221'-281' may be plate type conductors. An insulating layer 116' may be a surface layer 116' on a pillar 113'. An intermediate layer 114' of the pillar 113' may include, for example, p-type silicon. The intermediate layer 114' of the pillar 113' may serve as a body 114' of a second direction. An internal layer 115' of the pillar 113' may include insulating material. An erase operation of the memory block BLKp may be performed similarly to that of the memory block BLKj described with reference to FIGS. 19-24. Accordingly, detailed description thereof will be omitted herein.

As described above, a plurality of NAND string NS connected to one bit line BL may be independently erased by biasing ground select lines of the plurality of NAND strings NS connected to the bit line BL. The unit of the erase operation of the nonvolatile memory device 100 may be reduced. When the unit of the erase operation of the nonvolatile memory device 100 is reduced, time required for performance of background operations such as merge and garbage collection may be reduced. The operation speed of the nonvolatile memory device 100 may be improved. When the unit of the erase operation is reduced, storage capacity nullified when a specific erase unit is processed as bad may be reduced. Accordingly, the utilization of the storage capacity of the nonvolatile memory device 100 may be improved.

Figure 28:
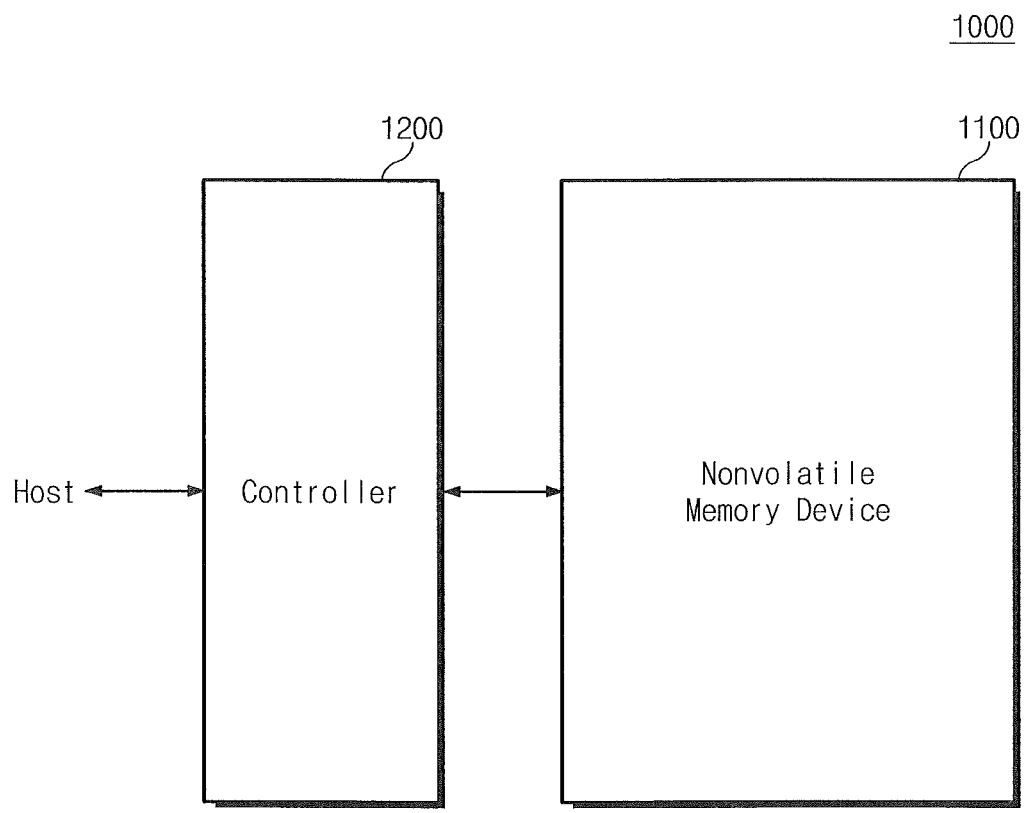

FIG. 28 is a block diagram illustrating a memory system 1000 including the nonvolatile memory device 100 of FIG. 1. Referring to FIG. 28, a memory system 1000 may include a nonvolatile memory device 1100 and a controller 1200. The nonvolatile memory device 1100 may be configured and operate as described with reference to FIGS. 1-27. The controller 1200 may be connected to a host and the nonvolatile memory device 1100. In response to a request from the host, the controller 1200 may be configured to access the nonvolatile memory device 1100. For example, the controller 1200 may be configured to control read, write, erase, and/or background operations of the nonvolatile memory device 1100. The controller 1200 may be configured to provide an interface between the nonvolatile memory device 1100 and the host. The controller 1200 may be configured to drive firmware for controlling the nonvolatile memory device 1100.

For example, as described with reference to FIG. 1, the controller 1200 may be configured to provide a control signal CTRL and an address ADDR to the nonvolatile memory device 1100. The controller 1200 may be configured to exchange data with the nonvolatile memory device 1100. For example, the controller 1200 may further include well-known components such as a Random Access Memory (RAM), a processing unit, a host interface, and/or a memory interface. The RAM may be used as at least one of an operating memory of a processing unit, a cache memory between the nonvolatile memory device 1100 and the host, and a buffer memory between the nonvolatile memory device 1100 and the host. The processing unit may control overall operations of the controller 1200.

The host interface may include a protocol for performing data exchange between the host and the controller 1200. For example, the controller 1200 may be configured to communicate with an external device (host) through at least one of various interface protocols such as Universal Serial Bus (USB) protocols, Multimedia Card (MMC) protocols, Peripheral Component Interconnection (PCI) protocols, PCI-Express (PCI-E) protocols, Advanced Technology Attachment (ATA) protocols, serial-ATA protocols, parallel-ATA protocols, Small Computer Small Interface (SCSI) protocols, Enhanced Small Disk Interface (ESDI) protocols, and Integrated Drive Electronics (IDE) protocols. The memory interface may interface with the nonvolatile memory device 1100. For example, the memory interface may include a NAND and/or NOR interface.

The memory system 1000 may be configured to include an error correction block. The error correction block may be configured to detect and correct an error of data read from the nonvolatile memory device 1100 using an error correction code ECC. For example, the error correction block may be a component of the controller 1200. The error correction block may be a component of the nonvolatile memory device 1100.

The controller 1200 and the nonvolatile memory device 1100 may be integrated into one semiconductor device. For example, the controller 1200 and the nonvolatile memory device 1100 may be integrated into one semiconductor device to be a memory card. For example, the controller 1200 and the nonvolatile memory device 1100 may be integrated into one semiconductor device to be memory cards such as PC cards (Personal Computer Memory Card International Association (PCMCIA)), Compact Flash (CF) cards, Smart Media (SM and SMC) cards, memory sticks, Multimedia cards (MMC, RS-MMC, and MMCmicro), SD cards (SD, miniSD, microSD, and SDHC), and/or Universal Flash Storages (UFS).

The controller 1200 and the nonvolatile memory device 1100 may be integrated into one semiconductor device to form semiconductor drives (Solid State Drive (SSD)). The semiconductor drive (SSD) may include storage devices configured to store data in semiconductor memories. When the memory system 1000 is used as a semiconductor drive (SSD), the operation speed of the host connected to the memory system 1000 may be improved.

As another example, the memory system 1000 may be one of various components of electronic devices such as Ultra Mobile PCs (UMPCs), workstations, net-books, Personal Digital Assistants (PDAs), portable computers, web tablets, wireless phones, mobile phones, smart phones, e-books, Portable Multimedia Players (PMPs), portable game consoles, navigation devices, black boxes, digital cameras, digital audio recorders, digital audio players, digital picture recorders, digital picture players, digital video recorders, digital video players, devices capable of sending/receiving information under wireless environments, one of various electronic devices constituting home networks, one of various electronic devices constituting computer networks, one of various electronic devices constituting telematics networks, RFID devices, and/or one of various components constituting computing systems.

For example, the nonvolatile memory device 1100 and/or the memory system 1000 may be mounted in various types of packages. The nonvolatile memory device 1100 and/or the memory system 1000 may be packaged using various methods such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

Figure 29:
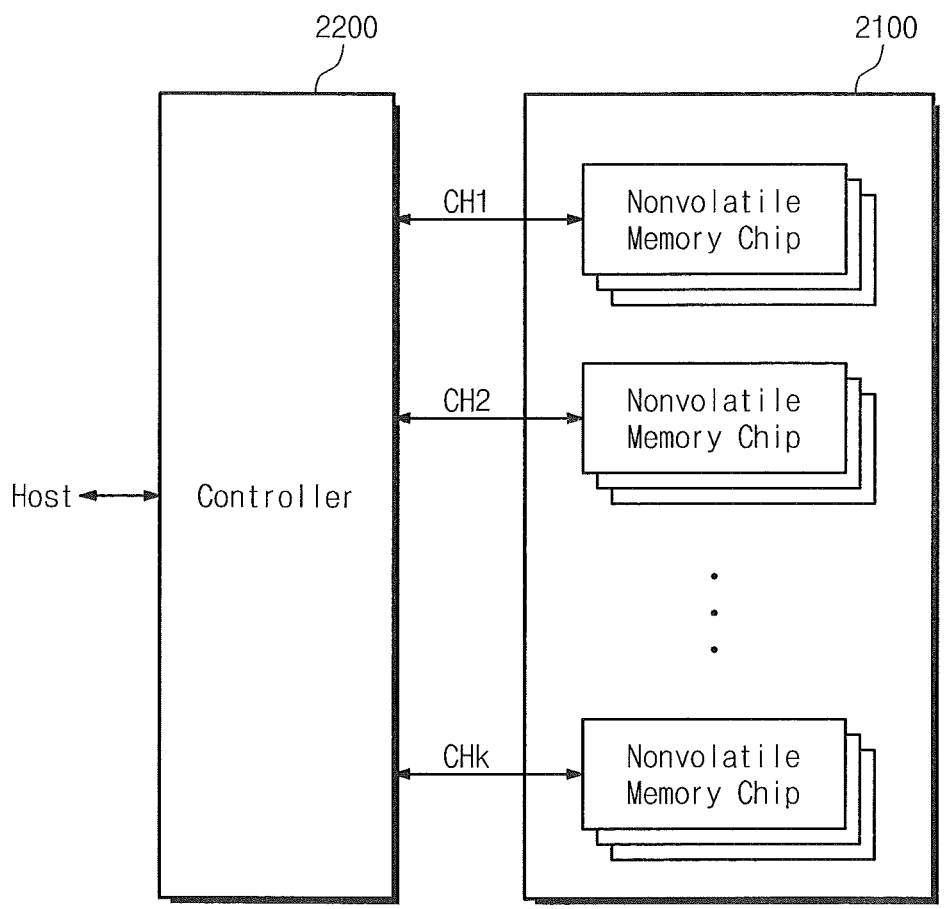

FIG. 29 is a diagram illustrating example applications of the memory system 1000 of FIG. 28. Referring to FIG. 29, a memory system 2000 may include a nonvolatile memory device 2100 and a controller 2200. The nonvolatile memory device 2100 may include a plurality of nonvolatile memory chips. The plurality of nonvolatile memory chips may be divided into a plurality of groups. Each group of the plurality of nonvolatile memory chips may be configured to communicate with the controller 2200 through one common channel. In FIG. 29, the plurality of nonvolatile memory chips are shown as communicating with the controller 2200 through first to k-th channels CH1-CHk. Each nonvolatile memory chip may be configured similarly to the nonvolatile memory device 100 described with reference to FIGS. 1-27. In FIG. 29, a plurality of nonvolatile memory chips are shown as being connected to one channel. However, the memory system 2000 may be modified such that one nonvolatile memory chip may be connected to one channel.

Figure 30:
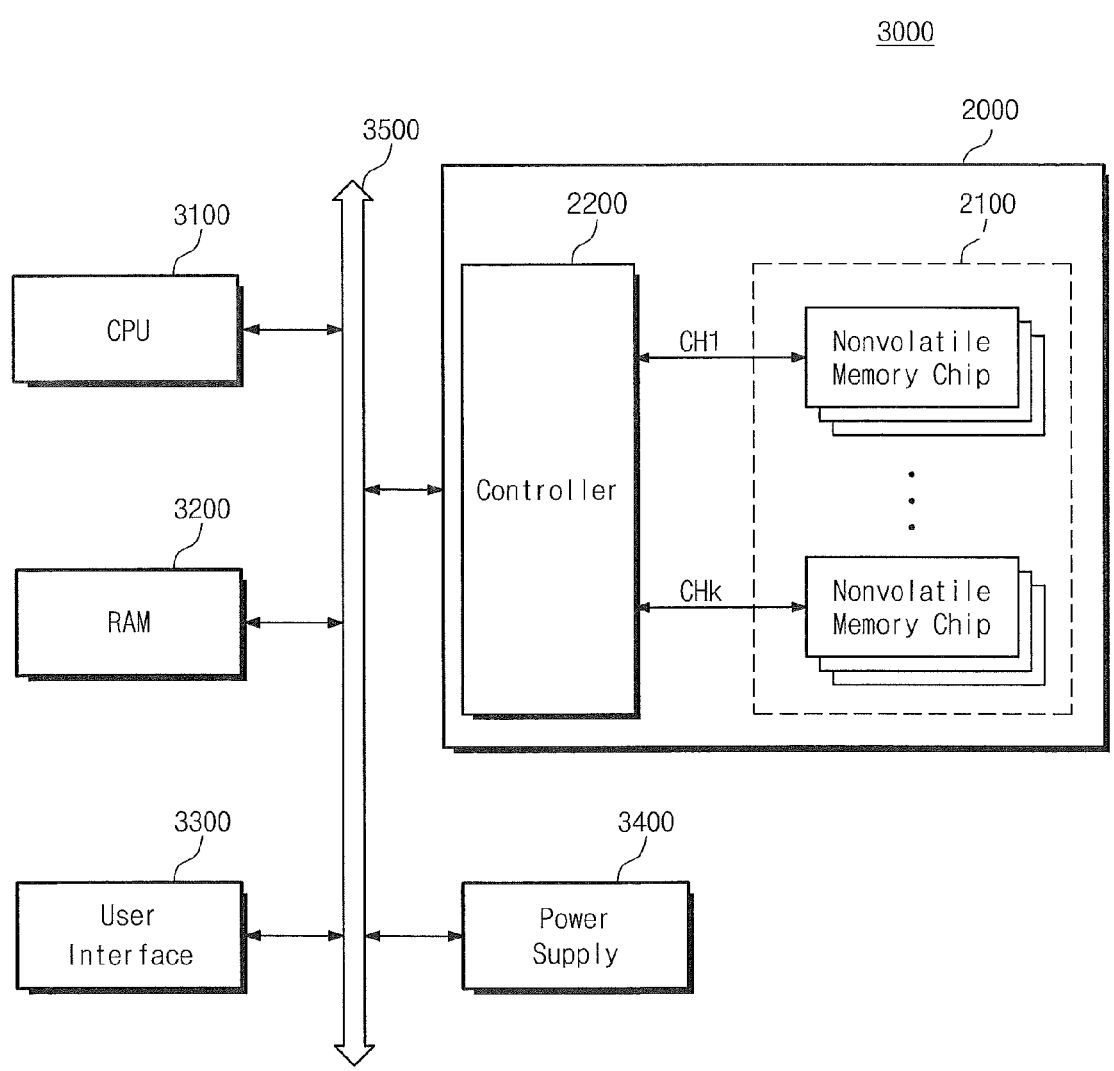

FIG. 30 is a diagram illustrating computing systems 3000 including the memory system 2000 described with reference to FIG. 29. Referring to FIG. 30, the computing system 3000 may include a central processing unit (CPU) 3100, a RAM 3200, a user interface 3300, a power supply 3400, and/or a memory system 2000. The memory system 2000 may be electrically connected to the CPU 3100, the RAM 3200, the user interface 3300, and/or the power supply 3400. Data provided through the user interface 3300 or processed by CPU 3100 may be stored in the memory system 2000.

In FIG. 30, the nonvolatile memory device 2100 is shown as being connected to a system bus 3500 through the controller 2200. However, the nonvolatile memory device 2100 may be configured to be directly connected to the system bus 3500. In FIG. 30, the memory system 2000 described with reference to FIG. 29 is shown. However, the memory system 2000 may be substituted with the memory system 1000 described with reference to FIG. 28. For example, the computing system 3000 may be configured to include all of the memory systems 1000 and 2000 described with reference to FIGS. 28 and 29.

While example embodiments have been particularly shown and described, it will be understood by one of ordinary skill in the art that variations in faun and detail may be made therein without departing from the spirit and scope of the claims.

What is claimed is:

1. An operating method, comprising:
 floating a first ground select line connected to a first string connected to a bit line;
 applying an erase prohibition voltage to a second ground select line connected to a second string connected to the bit line,
 the first and second strings each including a plurality of memory cells stacked on top of each other in a direction normal to a substrate;
 applying an erase operation voltage to the first and second strings; and
 applying a ground voltage to a plurality of word lines connected to the first and second strings during the applying the erase operation voltage to the first and second strings.

2. The operating method of claim 1, wherein the erase prohibition voltage is greater than a threshold voltage of a ground select transistor connected to the second ground select line of the second string.

3. The operating method of claim 1, wherein the applying of the erase operation voltage includes
 applying an erase voltage to a common source line connected to the first and second strings.

4. The operating method of claim 1, wherein the applying the erase operation voltage includes,
 floating a plurality of word lines connected to the first and second strings,
 applying a pre-voltage to a common source line connected to the first and second strings, and
 applying an erase voltage to the common source line.

5. The operating method of claim 1, further comprising:
 applying a second erase prohibition voltage to a third ground select line connected to the second string.

6. The operating method of claim 5, wherein the second erase prohibition voltage is less than the erase prohibition voltage.

7. The operating method of claim 5, wherein the second erase prohibition voltage is greater than a threshold voltage of a second ground select transistor connected to the second ground select line of the second string.

8. The operating method of claim 5, further comprising:
applying a third erase prohibition voltage to a string select line connected to the second string.

9. A nonvolatile memory device, comprising:
a memory cell array including first and second strings of memory cells connected between a bit line and a common source line, the strings each connected to at least one word line, at least one select line, and at least one ground select line;
a driver configured to apply voltages to the word lines, select lines, ground select lines and the common source line,
the driver configured to, during an erase operation, apply a same voltage to a first word line of the first string and a second word line of the second string, and to apply different voltages to a first ground select line of the first string and a second ground select line of the second string; and
a read & write circuit configured to write data to and read data from the memory cells of the first and second strings.

10. The nonvolatile memory device of claim 9, wherein the driver is configured to, during the erase operation, float the first ground select line, apply an erase prohibition voltage to the second ground select line, and apply erase operation voltages to the first and second word lines and the common source line.

11. The nonvolatile memory device of claim 10, wherein the driver is configured to, during the erase operation, apply a second erase prohibition voltage to a third ground select line connected to the second string.

12. The nonvolatile memory device of claim 11, wherein the second ground select line is between the third ground select line and the common source line, and the second erase prohibition voltage is less than the erase prohibition voltage.

13. The nonvolatile memory device of claim 9, wherein the driver is configured to, during the erase operation, apply a ground voltage to the first and second word lines, and apply an erase voltage to the common source line.

14. The nonvolatile memory device of claim 9, wherein the driver is configured to, during the erase operation, vary the voltage of the first and second word lines from a floating state to a ground voltage, and vary the voltage of the common source line from a pre-voltage to an erase voltage.

15. The nonvolatile memory device of claim 9, wherein the memory cells of the first and second strings are stacked in a direction normal to a substrate.

16. The nonvolatile memory device of claim 9, wherein the first and second word lines are electrically connected.

17. A memory system, comprising:
a nonvolatile memory device including,
a memory cell array with first and second strings of memory cells connected between a bit line and a common source line, the strings each connected to at least one word line, at least one select line, and at least one ground select line,
a driver configured to apply voltages to the word lines, select lines, ground select lines and the common source line, the driver configured to, during an erase operation, apply a same voltage to a first word line of the first string and a second word line of the second string, and to apply different voltages to a first ground select line of the first string and a second ground select line of the second string, and
a read & write circuit configured to write data to and read data from the memory cells of the first and second strings; and
a controller configured to control the nonvolatile memory device.

18. A semiconductor drive (Solid State Drive), comprising the memory system of claim 17.

19. A memory card, comprising the memory system of claim 17.

* * * * *